(12) United States Patent  
Tsai et al.

(10) Patent No.: US 10,770,624 B2  
(45) Date of Patent: Sep. 8, 2020

(54) SEMICONDUCTOR DEVICE PACKAGE, OPTICAL PACKAGE, AND METHOD FOR MANUFACTURING THE SAME

(71) Applicant: Advanced Semiconductor Engineering, Inc., Kaohsiung (TW)

(72) Inventors: Chang Chin Tsai, Kaohsiung (TW); Chun-Han Chen, Kaohsiung (TW); Hsin-Ying Ho, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 83 days.

(21) Appl. No.: 16/132,206

(22) Filed: Sep. 14, 2018

(65) Prior Publication Data

US 2019/0115505 A1 Apr. 18, 2019

Related U.S. Application Data

(60) Provisional application No. 62/571,664, filed on Oct. 12, 2017.

(51) Int. Cl.
| | |
|---|---|
| *H01L 33/48* | (2010.01) |
| *H01S 5/022* | (2006.01) |
| *H01S 5/40* | (2006.01) |
| *H01L 33/56* | (2010.01) |
| *H01L 23/528* | (2006.01) |
| *H01L 33/62* | (2010.01) |

(52) U.S. Cl.
CPC ............ *H01L 33/486* (2013.01); *H01L 33/56* (2013.01); *H01S 5/02228* (2013.01); *H01S 5/02244* (2013.01); *H01S 5/02272* (2013.01); *H01S 5/02276* (2013.01); *H01S 5/4031* (2013.01); *H01L 23/528* (2013.01); *H01L 33/62* (2013.01); *H01S 5/02208* (2013.01); *H01S 5/02268* (2013.01); *H01S 5/02288* (2013.01)

(58) Field of Classification Search
CPC ...................................................... H01L 33/486
See application file for complete search history.

(56) References Cited

U.S. PATENT DOCUMENTS

| | | | |
|---|---|---|---|
| 2006/0292720 A1 | 12/2006 | Nishikawa | |
| 2011/0193105 A1* | 8/2011 | Lerman | ..................... F21K 9/20 257/88 |

* cited by examiner

*Primary Examiner* — Anne M Hines  
(74) *Attorney, Agent, or Firm* — Foley & Lardner LLP

(57) ABSTRACT

A semiconductor package includes a first substrate having a first surface, a second substrate on the first surface of the first substrate, the second substrate having a first surface and a second surface adjacent to the first surface, and the first surface of the second substrate being disposed on the first surface of the first substrate, and a light source on the second surface of the second substrate. A method for manufacturing the semiconductor device package is also provided.

20 Claims, 32 Drawing Sheets

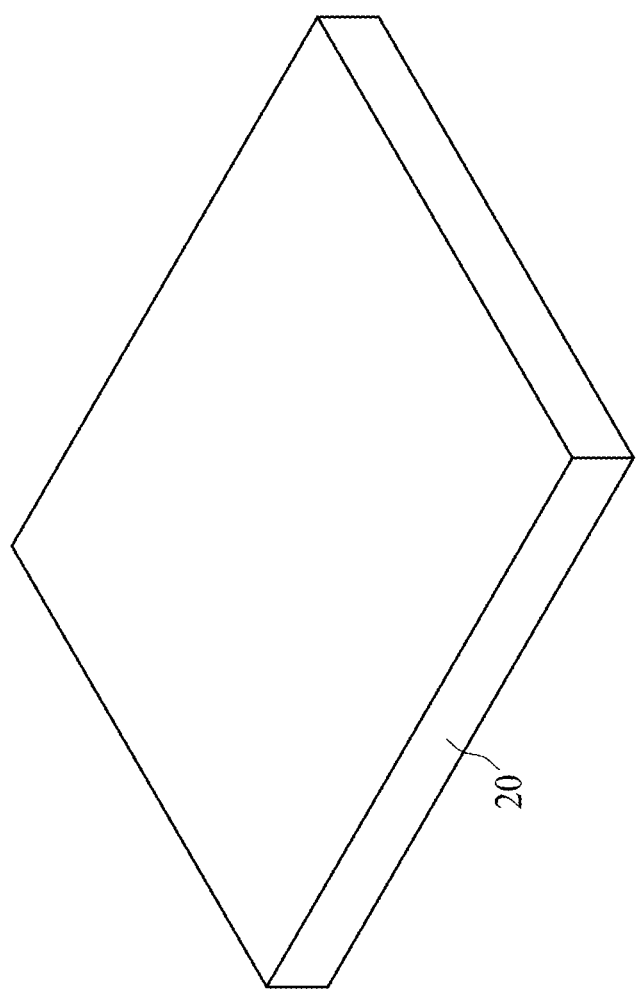

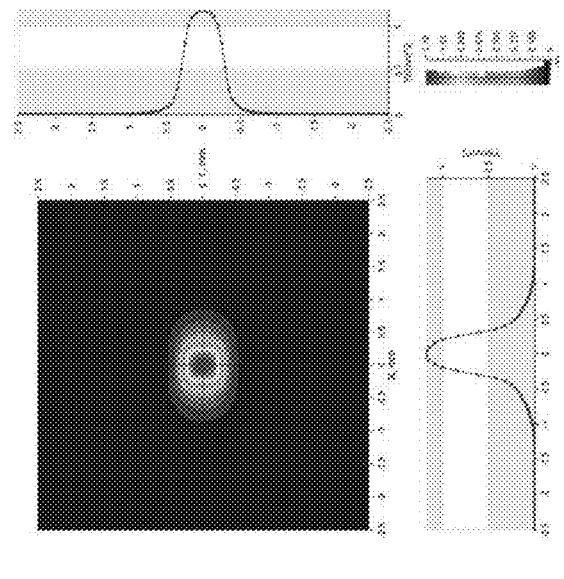
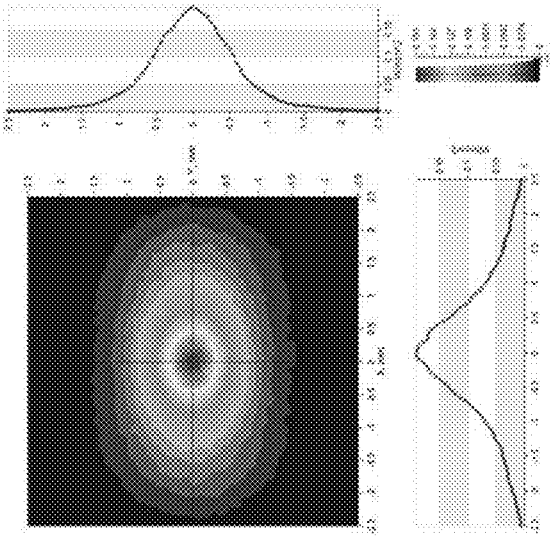
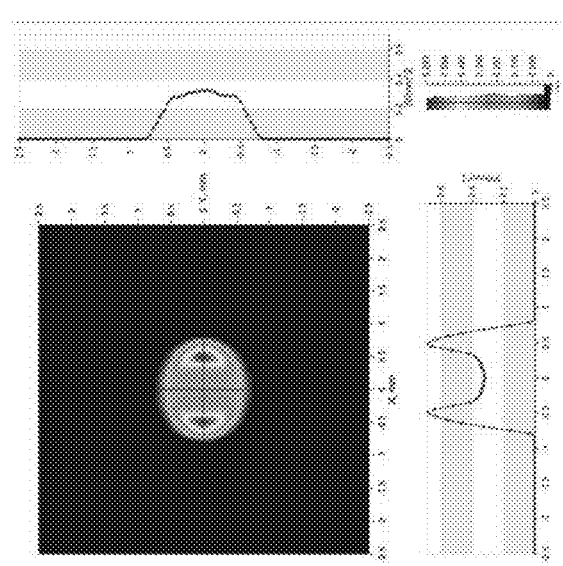
FIG. 7B
FIG. 7C
FIG. 7A

SEMICONDUCTOR DEVICE PACKAGE, OPTICAL PACKAGE, AND METHOD FOR MANUFACTURING THE SAME

CROSS REFERENCE TO RELATED APPLICATIONS

This application claims the benefit of and priority to U.S. Provisional Application No. 62/571,664, filed Oct. 12, 2017, the disclosure of which is hereby incorporated by reference in its entirety.

BACKGROUND

Non-invasive medical tests and treatments are used or developed to replace invasive medical tests. For example, to avoid risk of infection associated with measuring blood sugar levels by finger prick, an optical apparatus may be used to perform a blood glucose test. The optical apparatus may detect optical changes (e.g. change from the incident light (on the aqueous humor/liquid in the anterior chamber of the eye ball) to the emergent light) to determine blood glucose concentrations. The optical apparatus may also be applied to time of flight (TOF), three-dimensional scanners (3D scanners), Lidar, biosensors, or the like.

The optical apparatus may include an optical/light source. The optical/light source may include but is not limited to a light-emitting diode (LED), a vertical-cavity surface-emitting laser (VCSEL), a semiconductor laser diode with laser beam emission perpendicular from the top surface or edge-emitting semiconductor laser diode (also in-plane laser diode). The optical/light source may be assembled to an optical land grid array (OLGA) type package or other types of packages.

SUMMARY

Some embodiments of the present disclosure provide a semiconductor package, including a first substrate having a first surface, a second substrate on the first surface of the first substrate, the second substrate having a first surface and a second surface adjacent to the first surface, and the first surface of the second substrate being disposed on the first surface of the first substrate, and a light source on the second surface of the second substrate.

Some embodiments of the present disclosure provide an optical package structure, including a substrate having a first surface, and a light source on the first surface of the substrate, the light source having a light-emitting surface, a first surface opposite to the light-emitting surface, and a second surface between the light-emitting surface and the first surface. The first surface of the light source faces the first surface of the substrate. The light source includes a plurality of connection elements on the second surface.

Some embodiments of the present disclosure provide a method of manufacturing an optical package structure, including providing a substrate, providing an optical module, forming a support structure over the substrate, and integrating the optical module with the substrate via the support structure, the light emitting surface being distal to the substrate. The optical module includes a carrier having a first surface, an edge emitting device on the first surface and electrically coupled to the carrier, and a protection element covering the edge emitting device and the carrier. The edge emitting device includes a light emitting surface.

BRIEF DESCRIPTION OF THE DRAWINGS

Characteristics of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 7A, FIG. 7B, and FIG. 7C show various simulation results of a semiconductor package structure, in accordance with some embodiments of the present disclosure.

DETAILED DESCRIPTION

Non-invasive medical tests and treatments using optical devices are gaining popularity. Medical treatments may utilize low power light source, for example, LED or VCSEL light source, with optical power less than about 3 milliwatt (mW). Current non-invasive medical applications on blood sugar level measurement specify an optical source to emit at about 1650 nm and with optical power greater than 30 mW. Weak optical power of the LED and VCSEL will lead to calculation failure as a result of high noise or low signal intensity. In addition, LED emits non-collimated light with broad emission spectrum, which prevents LED from being used in laser light source applications.

The optical/light source in the present disclosure may emit light at a wavelength of approximately 1650 nanometers (nm) but can be varied or changed in other embodiments of the subject application. The optical/light source may emit light of approximately 1650 nm but can be varied or changed in other embodiments of the subject application. The optical/light source may emit light having power/intensity equal to or greater than approximately 30 mW but can be varied or changed in other embodiments of the subject application. Light power/intensity smaller than approximately 30 mW may be absorbed by e.g. aqueous humor/liquid in the anterior chamber of the eye ball and adversely affect performance of the optical apparatus.

The present disclosure provides a light-emitting device package for non-invasive medical applications. Via packaging techniques, the light-emitting device package is able to emit in a desired direction and preserve collimated light. With molding or silicone lid protection, the light-emitting device package is turned 90 degrees and placed on a substrate. The light-emitting device package is then integrated with a housing and optical elements.

Figure 1:
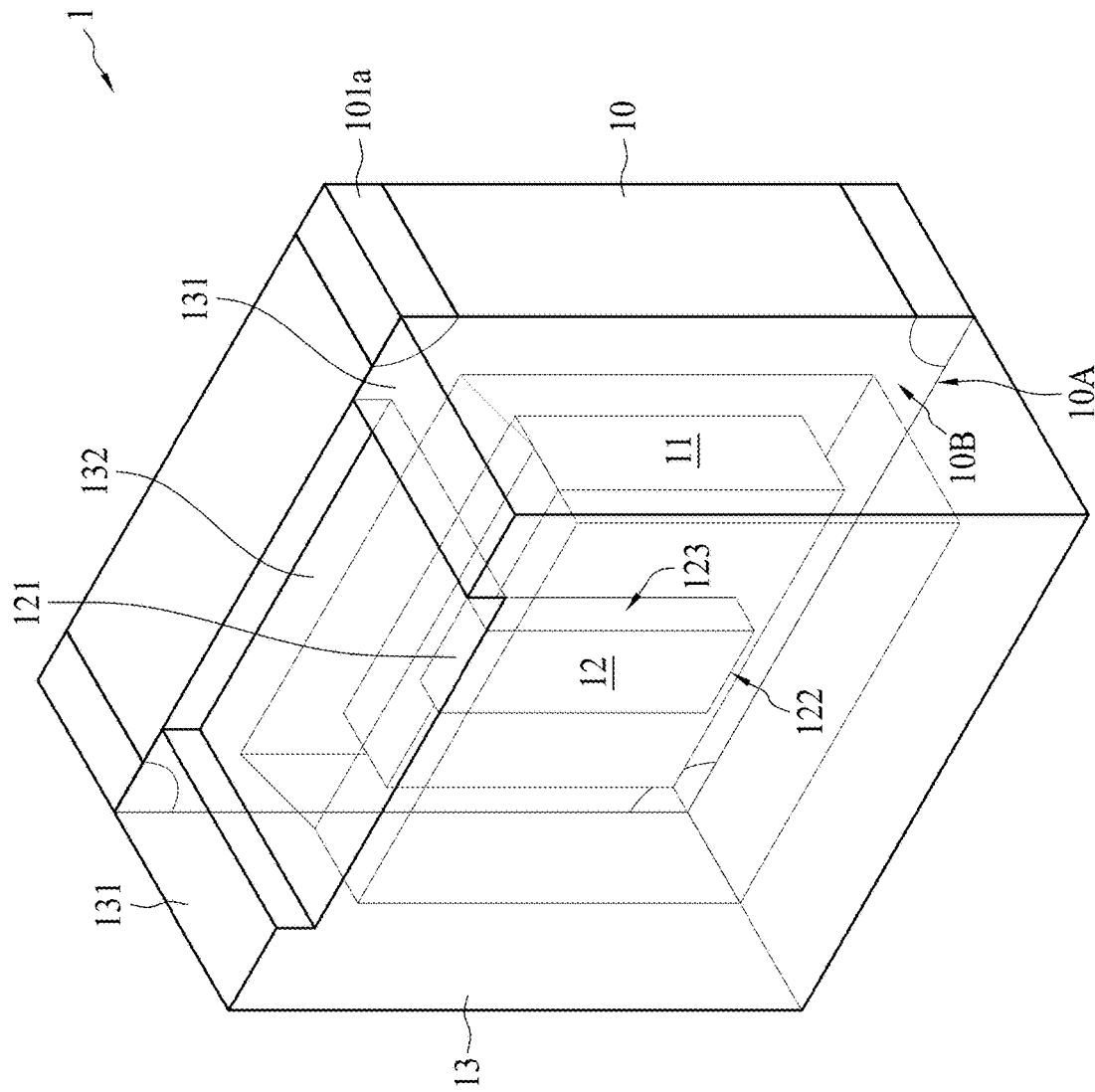
FIG. 1 illustrates a perspective view of a semiconductor package structure, according to an aspect of the present disclosure.

FIG. 1 illustrates a semiconductor device package 1 in accordance with some embodiments of the present disclosure. The semiconductor device package 1 shown in FIG. 1 includes a substrate 10, an interposer 11, a light source 12, and a protection element 13. In some embodiments, the substrate 10 is a carrier in the present disclosure.

The substrate 10 includes a circuitry structure (not shown in FIG. 1). The substrate 10 may include conductive traces, pads and/or vias (not shown in FIG. 1). The substrate 10 has a number of conductive terminals or conductive vias 101a configured to electrically couple with the light source 12. The substrate 10 may include but is not limited to FR4, Bismaleimide Triazine (BT), resin, epoxy or other suitable materials.

The interposer 11 includes a circuitry structure (not shown in FIG. 1). The interposer 11 may include conductive traces, pads and/or vias (not shown in FIG. 1). The interposer 11 is disposed on the substrate 10 and between a surface 10B of the substrate 10 and the light source 12. The interposer 11 is electrically connected to the substrate 10. The interposer 11 may include but is not limited to FR4, BT, resin, epoxy or other suitable materials. Although it is not illustrated in FIG. 1, it is contemplated that the interposer 11 may be eliminated in accordance with some other embodiments of the present disclosure.

The light source 12 may include but is not limited to a light-emitting diode (LED), a vertical-cavity surface-emitting laser (VCSEL), a semiconductor laser diode with laser beam emission perpendicular from the top surface or an edge-emitting semiconductor laser diode (also an in-plane laser diode). The light source 12 includes an edge-emitting semiconductor laser diode (also an in-plane laser diode). The light source 12 includes a light-emitting surface 121. The light source 12 may emit light at wavelengths of approximately 1650 nm but can be varied or changed in other embodiments of the subject application. The light source 12 may emit approximately 1650 nm wavelength band light but can be varied or changed in other embodiments of the subject application. In some embodiments, the light source 12 is disposed on the interposer 11. The light source 12 is electrically connected to the interposer 11. In some embodiments, the light source 12 is disposed on the substrate 10.

The protection element 13 is disposed on a surface 10B of the substrate 10. Note the interposer 11 or the light source 12 is disposed on the surface 10B. Alternatively stated, the surface 10B is substantially perpendicular to the light emitting surface 121. The protection element 13 is disposed on the interposer 11, the surface 10B of the substrate 10, or on the light source 12. The protection element 13 protects the light source 12 from being damaged. The protection element 13 protects the light source 12 from being damaged during the manufacturing process.

A surface 10A of the substrate 10 is adjacent or perpendicular to the surface 10B. The light emitting surface 121 is facing a direction opposite to a direction the surface 10A of the substrate 10 is facing. In some embodiments, the surface 10A of the substrate 10 is further positioned on another carrier or substrate (not shown in FIG. 1).

The protection element 13 includes a protrusion structure having a surface 131 and a surface 132. The surface 132 is recessed from the surface 131 to prevent itself from being scratched with other components during manufacturing and handling operations, thereby increasing the surface roughness as well as increasing the signal-to-noise ratio from a detector paired with the semiconductor device package 1. The surface 131 is protruded from the surface 132. The surface 131 is above or higher than the surface 132. The surface 132 is lower than the surface 131. The surface 132 may have a surface roughness (Ra) smaller than approximately 0.1. The surface 132 may be polished to have a relatively smaller surface roughness (Ra) than that of the surface 131. The protection element 13 may include but is not limited to, for example, silicone, transparent epoxy, transparent molding compound/encapsulant (which may include e.g. resin and fillers/particles), glass or other transparent materials.

In some embodiments, the protection element 13 is spaced from the light source 12 and/or the interposer 11 by a distance. When light emits from the light emitting surface, it first propagates through the air and then enters the protection element 13. The semiconductor device package 1 includes an air-type semiconductor device package. The protection element 13 includes transparent material (e.g. silicone) having a refractive index equal to or less than approximately 1.4 measured at a wavelength of approximately 1650 nm. The protection element 13 includes transparent material (e.g. silicone) having a transmittance equal to or greater than approximately 80% measured at a wavelength of approximately 1650 nm. The protection element 13 includes transparent material (e.g. glass) having a refractive index equal to or less than approximately 1.45 measured at a wavelength of approximately 1650 nm. The protection element 13 includes transparent material (e.g. glass) having a transmittance equal to or greater than approximately 90% measured at a wavelength of approximately 1650 nm. Light emitted from the light-emitting surface 121 may pass through the surface 132 of the protrusion structure.

FIG. 1A, FIG. 1B, FIG. 1C, FIG. 1D and FIG. 1E are perspective views of a semiconductor structure fabricated at various stages, in accordance with some embodiments of the present disclosure. Various figures have been simplified for a better understanding of the aspects of the present disclosure.

Figure 1A:
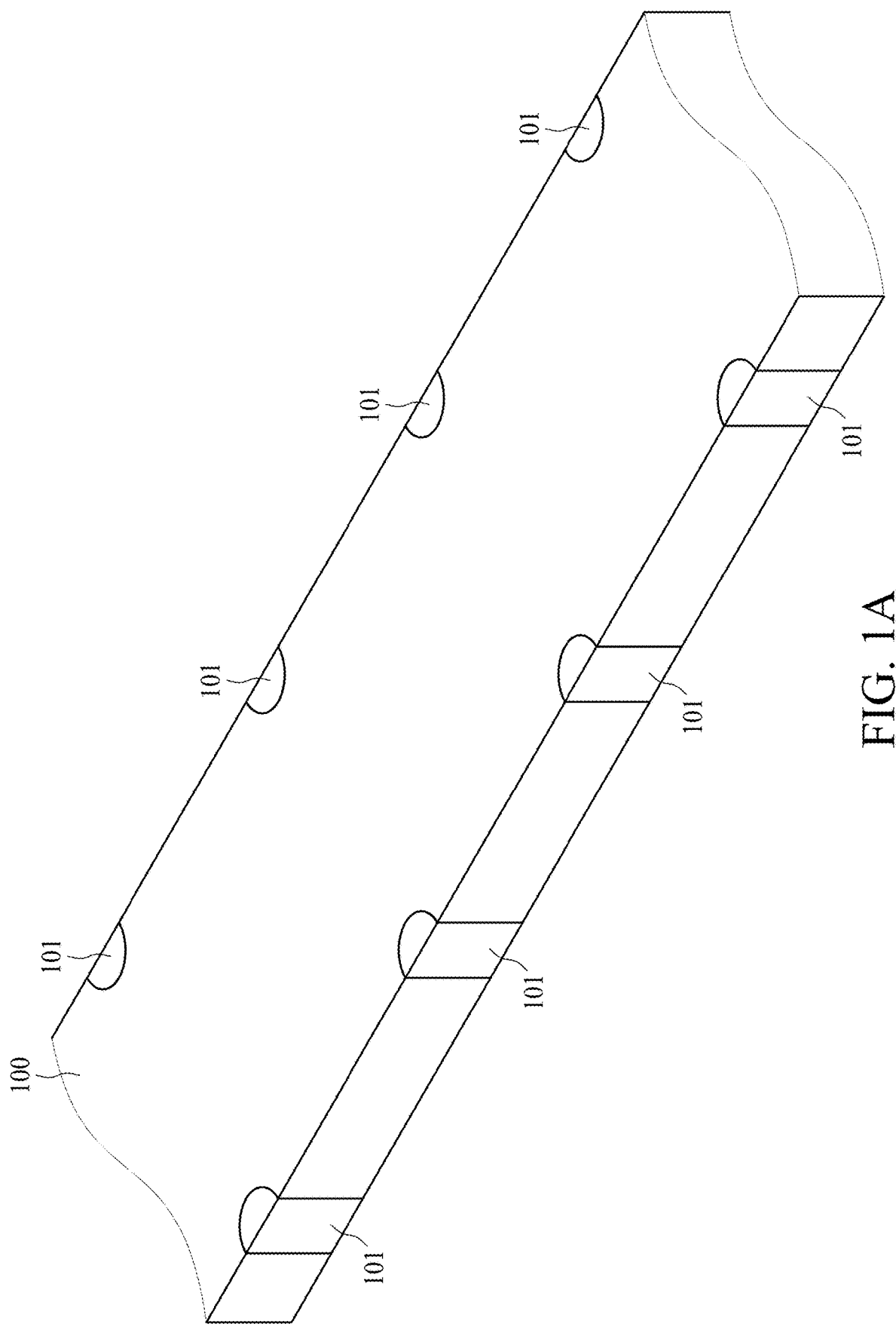
FIG. 1A, FIG. 1B, FIG. 1C, FIG. 1D, and FIG. 1E illustrate manufacturing operations of a semiconductor package structure during intermediate stages, according to an aspect of the present disclosure.

Referring to FIG. 1A, a strip of substrate units 100 is provided. The strip of substrate units 100 may include a number of substrate units 100. A number of conductive through vias 101 are formed in the strip of substrate units 100. Each of the substrate units 100 comprises a circuitry structure (not shown in FIG. 1A). Each of the substrate units 10 may include conductive traces, pads and/or vias. Each of the substrate units 100 may have a number of conductive vias 101. The substrate 100 may include but is not limited to FR4, BT, resin, epoxy or other suitable materials. Although it is not illustrated in FIG. 1A, it is contemplated that a layer of nickel (Ni) and/or a layer of gold (Au) may be formed on the conductive vias 101 to facilitate connection. Although it is not illustrated in FIG. 1A, it is contemplated that a panel of substrate units 100 may replace the strip of substrate units 100.

Figure 1B:
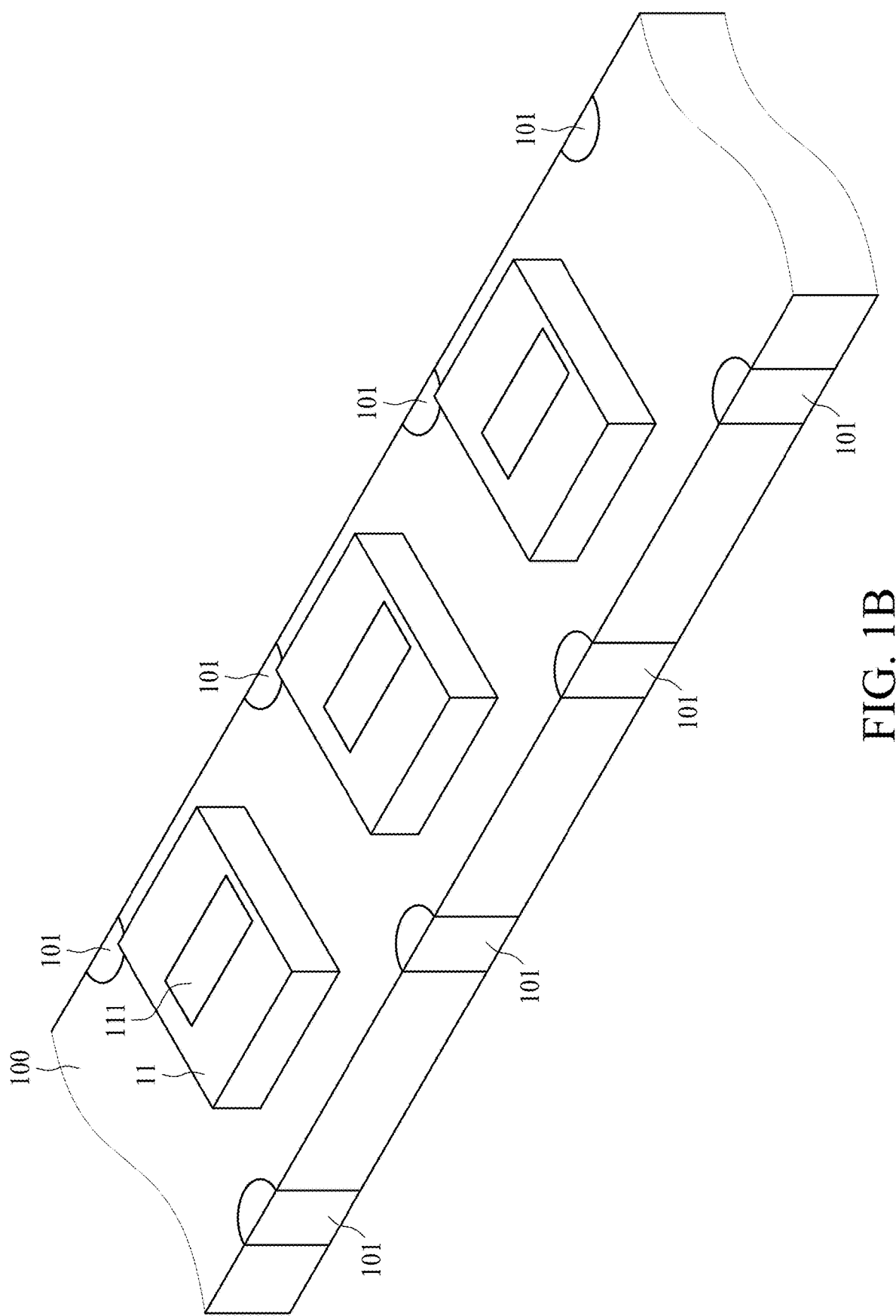

Referring to FIG. 1B, an interposer 11 is disposed on each of the substrate units 100. The interposer 11 has an area 111. The interposer 11 includes a circuitry structure (not shown in FIG. 1A). The interposer 11 may include conductive traces, pads and/or vias (not shown in FIG. 1A). The interposer 11 is electrically connected to each of the substrate units 100. The interposer 11 may include but is not limited to FR4, BT, resin, epoxy or other suitable materials.

Figure 1C:
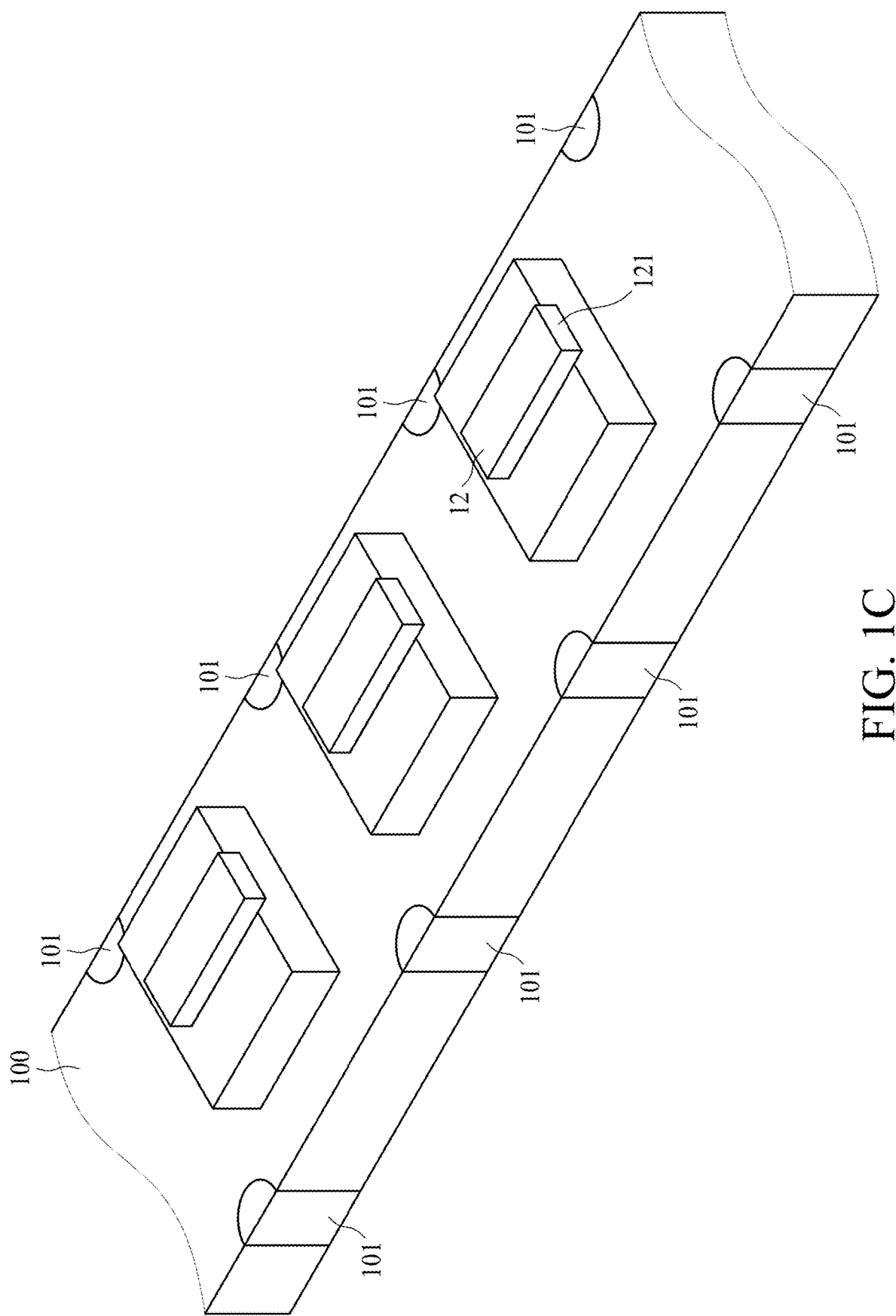

Referring to FIG. 1C, a light source 12 is disposed on the area 111 of the interposer 11. The light source 12 may include but is not limited to a light-emitting diode (LED), a vertical-cavity surface-emitting laser (VCSEL), a semiconductor laser diode with laser beam emission perpendicular from the top surface or an edge-emitting semiconductor laser diode (also an in-plane laser diode). The light source 12 comprises an edge-emitting semiconductor laser diode (also an in-plane laser diode). The light source 12 includes a light-emitting surface 121. The light source 12 is disposed on the interposer 11. The light source 12 is electrically connected to the interposer 11. Each of the anodes and cathodes of the light source 12 is electrically connected to each of the conductive vias 101. The light-emitting surface 121 is disposed to be protruded from an edge or a periphery of the interposer 11. Protruded light-emitting surface 121 permits a greater light spreading angle without obstruction by the edge of the interposer 11. Although it is not illustrated in FIG. 1C, it is contemplated that the light-emitting surface 121 may be aligned with an edge or a periphery of the interposer 11. Although it is not illustrated in FIG. 1C, it is contemplated that the light-emitting surface 121 may be within an edge or a periphery of the interposer 11.

Figure 1D:
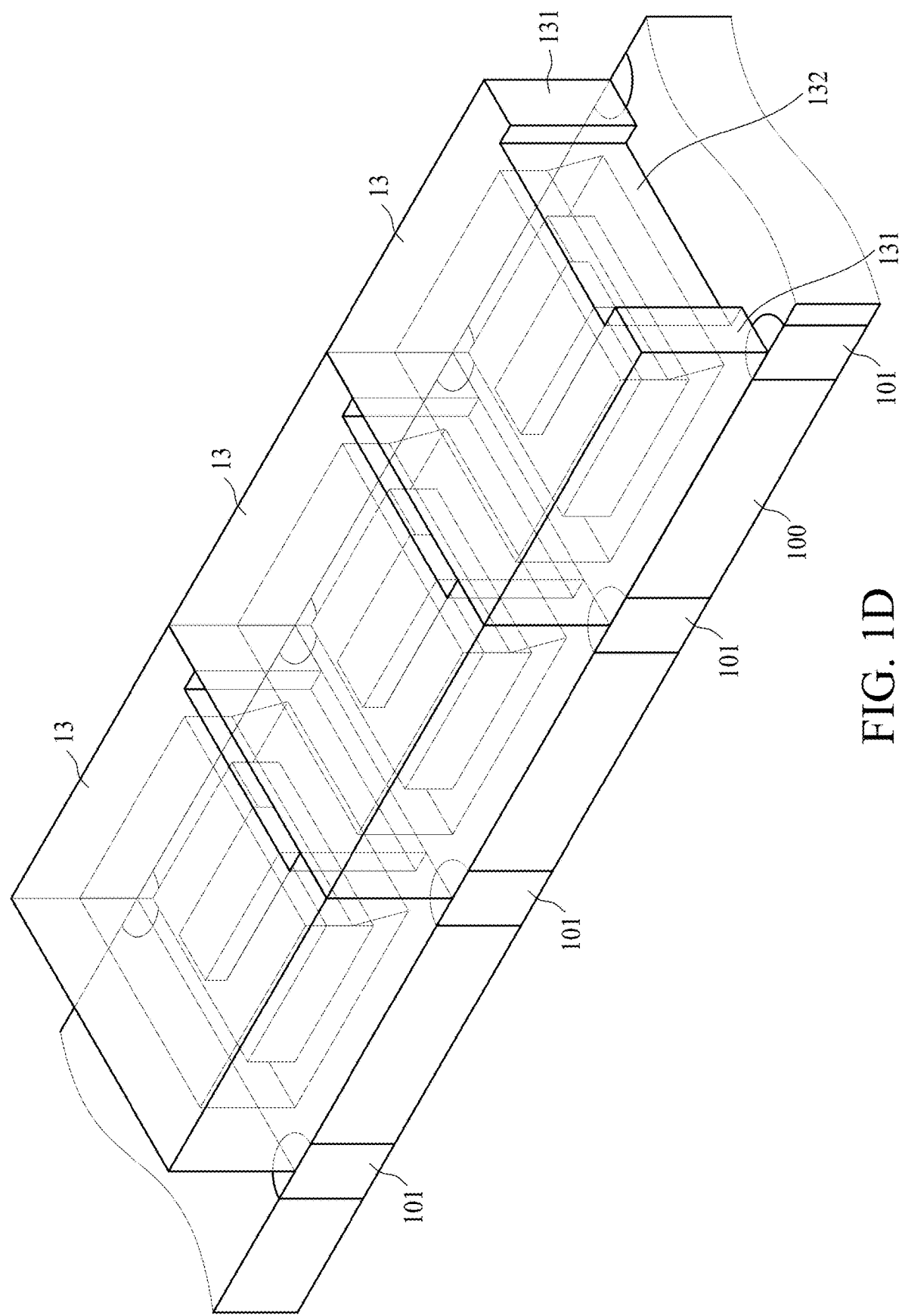

Referring to FIG. 1D, a strip of protection elements 13 is disposed on the strip of substrate units 100. The protection element 13 comprises a protrusion structure having a surface 131 and a surface 132. The surface 132 is recessed from the surface 131. The surface 131 is protruded from the surface 132. The surface 132 may have a surface roughness (Ra) smaller than approximately 0.1 or smaller than a surface roughness (Ra) of the surface 131. The protection element 13 may include but is not limited to, for example, silicone, transparent epoxy, transparent molding compound/encapsulant (which may include e.g. resin and fillers/particles), glass or other transparent materials. The protection element 13 is spaced from the light source 12. The protection element 13 is separated from the light source 12 by a distance. The protection element 13 is separated from the light-emitting surface 121 of the light source 12 by a distance. The protection element 13 includes transparent material (e.g. silicone) having a refractive index equal to or less than approximately 1.4 measured with a wavelength of approximately 1650 nm. The protection element 13 includes transparent material (e.g. silicone) having a transmittance equal to or greater than approximately 80% measured with a wavelength of approximately 1650 nm. The protection element 13 includes transparent material (e.g. glass) having a refractive index equal to or less than approximately 1.45 measured with a wavelength of approximately 1650 nm. The protection element 13 includes transparent material (e.g. glass) having a transmittance equal to or greater than approximately 90% measured with a wavelength of approximately 1650 nm. Light emitted from the light-emitting surface 121 may pass through the surface 132. The light-emitting surface 121 is disposed adjacent to the surface 132.

Figure 1E:
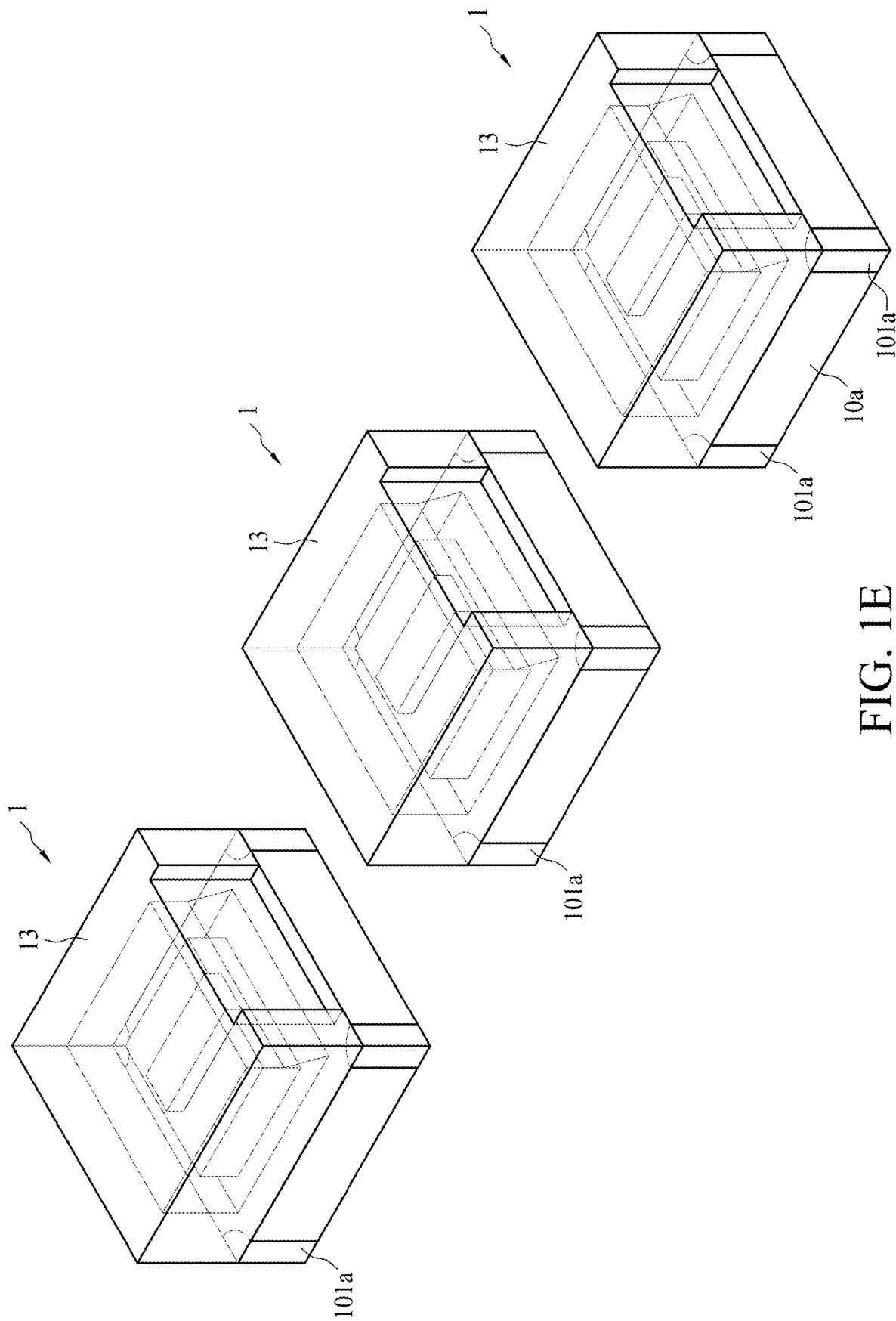

Referring to FIG. 1E, a singulation or sawing operation is performed to form a number of semiconductor device packages 1 as illustrated and described with reference to FIG. 1.

Figure 2:
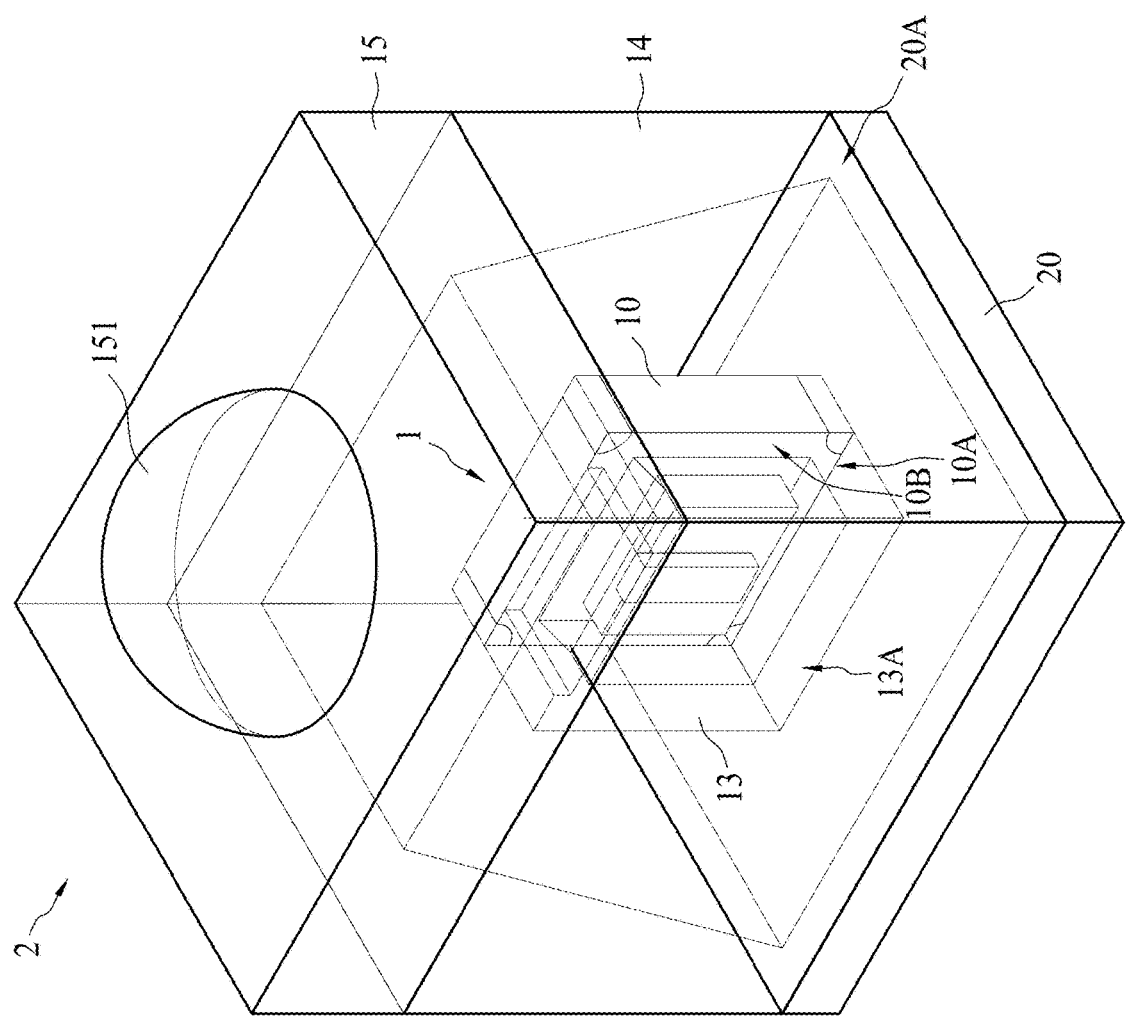
FIG. 2 illustrates a perspective view of an optical package structure, according to an aspect of the present disclosure.

FIG. 2 illustrates an optical package structure 2 in accordance with some embodiments of the present disclosure. The optical package structure 2 shown in FIG. 2 includes a first substrate 20, a semiconductor device package 1, a housing 14 and an optical lid 15. As shown in FIG. 2, the light source 12 of the semiconductor device package 1 has a first projection area on the first surface 20A of the first substrate 20 and a second projection area on the second surface 10B of the second substrate 10. In some embodiments, the first projection area is smaller than the second projection area.

The first substrate 20 is similar to the second substrate 10 as illustrated and described with reference to FIG. 1. The first substrate 20 may include but is not limited to FR4, BT, resin, epoxy or other suitable materials.

The optical package structure 2 is the same or similar to the semiconductor device package 1 as illustrated and described with reference to FIG. 1. The semiconductor device package 1 is disposed on the first substrate 20. The semiconductor device package 1 is electrically connected to the first substrate 20. The semiconductor device package 1 has a second substrate 10 with a surface 10A (illustrated in FIG. 1) opposite to the light-emitting surface 121. The surface 10A of the semiconductor device package 1 is bonded to the first surface 20A of the first substrate 20.

The protection element 13 of the semiconductor device package 1 has a side surface or lateral surface (not denoted in FIG. 2) opposite to the surface 131 and the surface 132. A surface 13A of the protection element 13 is in contact with the first substrate 20.

The housing 14 is disposed on the first substrate 20. The housing 14 surrounds the semiconductor device package 1. The housing 14 defines a space to accommodate or receive the semiconductor device package 1. The housing 14 is not in contact with the semiconductor device package 1. Instead, an inner surface of the housing 14 is separated from the semiconductor device package 1. Alternatively, the housing 14 has an opening over the light-emitting surface 121 by a distance.

The optical lid 15 includes a transparent material. The optical lid 15 includes an optical lens 151. The optical lid 15 is disposed over the first surface 20A of the first substrate 20, as well as over the light-emitting surface 121 of the light source 12. The optical lid 15 is disposed on the housing 14. The optical lid 15 is supported by the housing 14. The optical lid 15 is disposed over the semiconductor device package 1. The optical lid 15 is separated from the semiconductor device package 1 by a distance. The optical lens 151 is disposed over the semiconductor device package 1. The optical lens 151 is disposed over the light-emitting surface 121. The optical lens 151 is disposed over the surface 132. Light emitted from the light-emitting surface 121 may pass through the surface 132 and arrive at the optical lens 151. The light-emitting surface 121, the surface 132 and the optical lens 151 may be aligned with one another. In some embodiments, the optical lens 151 is a collimation lens configured to collimate the light emitting from the light source 12.

Figure 2B:
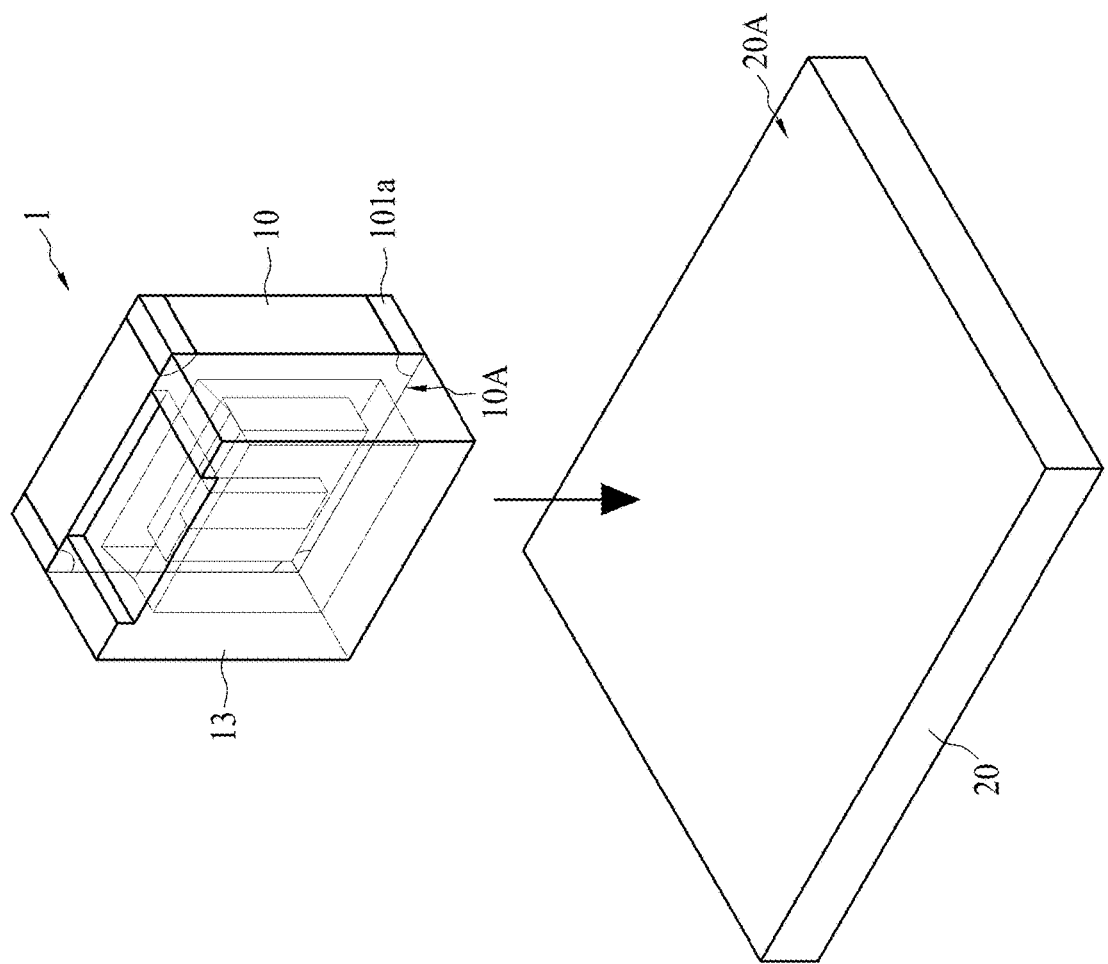
FIG. 2A, FIG. 2B, FIG. 2BA, FIG. 2BB, FIG. 2BC, and FIG. 2C illustrate manufacturing operations of a semiconductor package structure during intermediate stages, according to an aspect of the present disclosure.
Figure 2B:
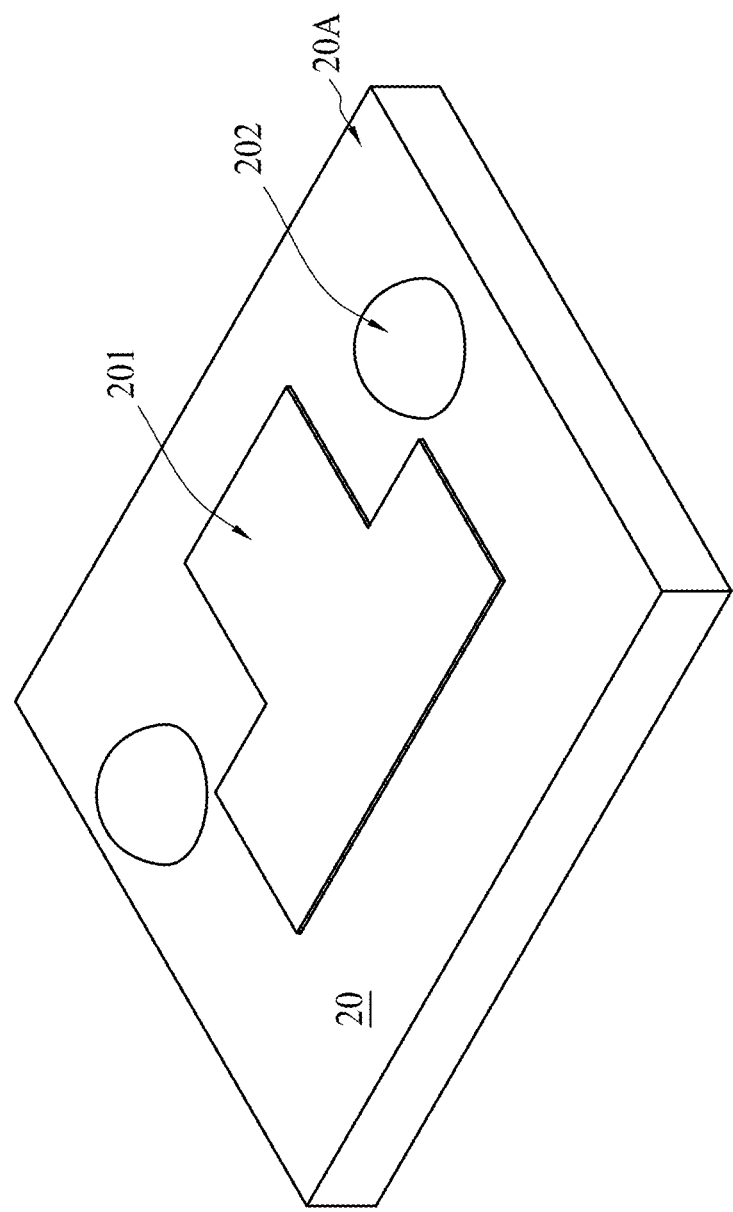
Figure 2B:
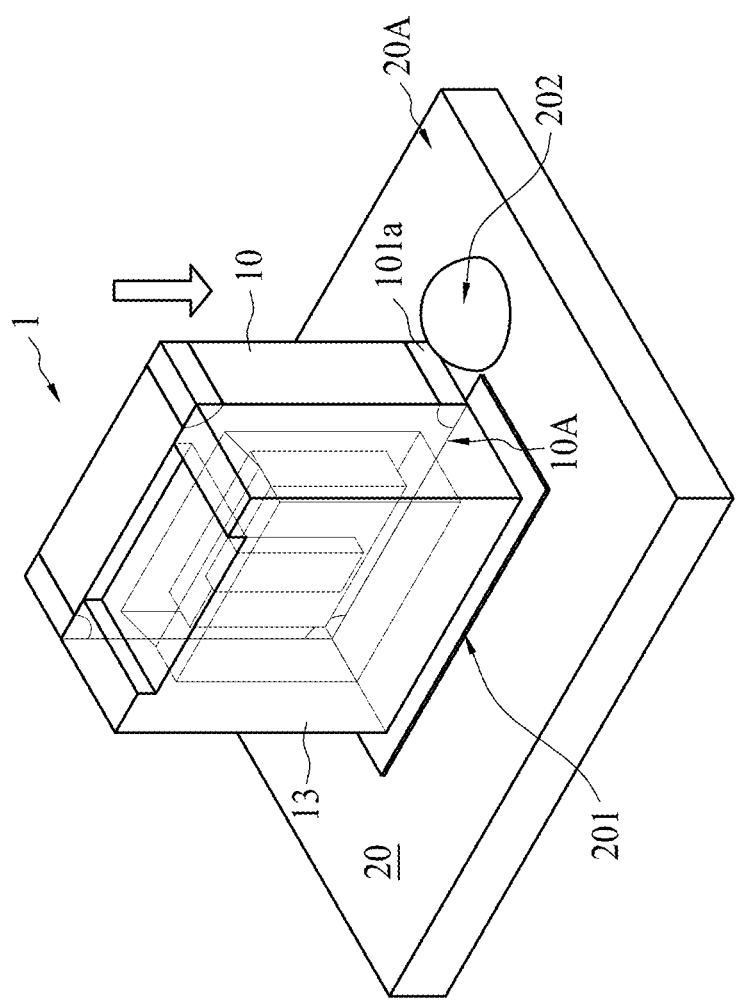
Figure 2B:
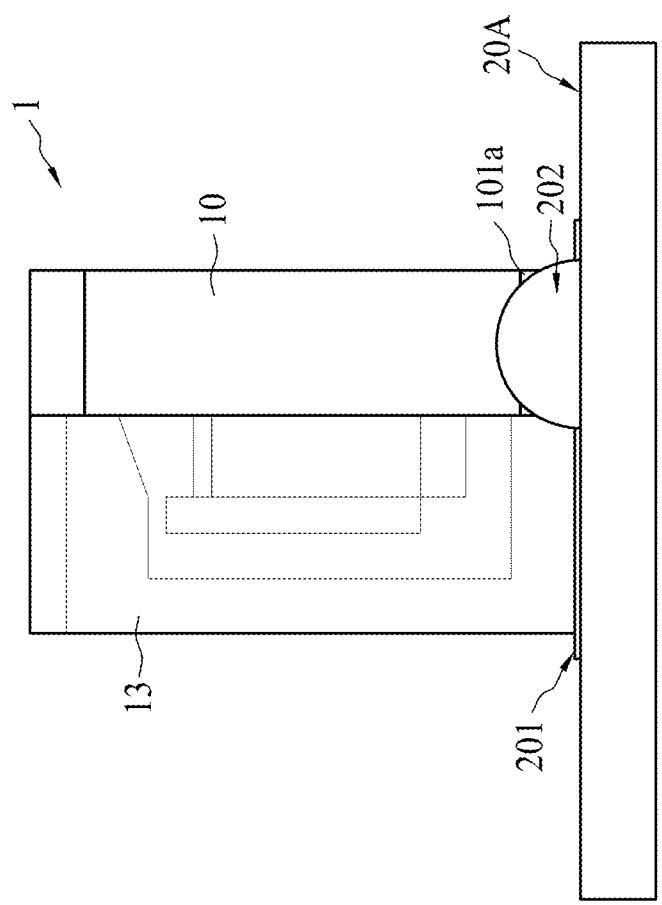
Figure 2C:
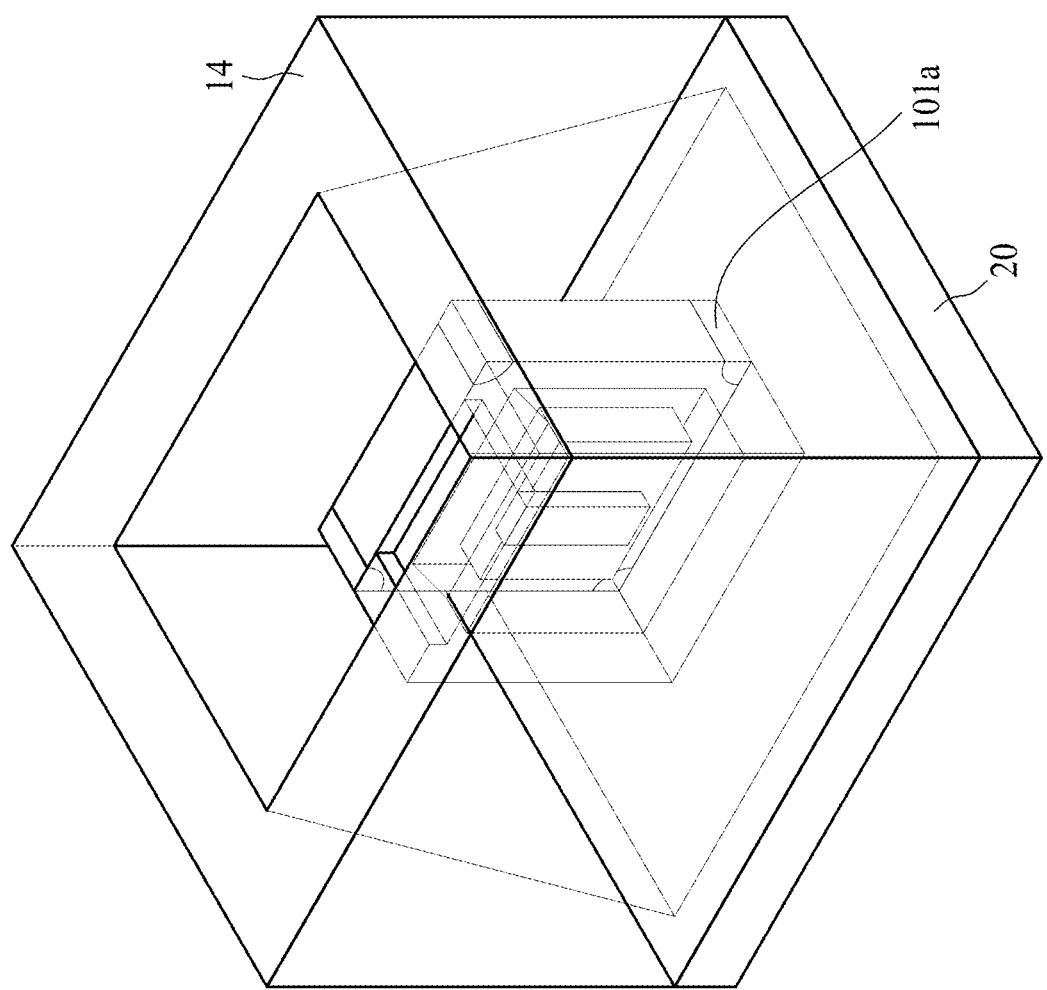

FIG. 2A, FIG. 2B, FIG. 2BA, FIG. 2BB, FIG. 2BC, and FIG. 2C are cross-sectional views of an optical package fabricated at various stages, in accordance with some embodiments of the present disclosure. Various figures have been simplified for a better understanding of the aspects of the present disclosure.

Referring to FIG. 2A, a first substrate 20 is provided. The first substrate 20 includes a circuitry structure (not shown in FIG. 2A). The first substrate 20 may include conductive traces, pads and/or vias (not shown in FIG. 2A). The first substrate 20 may include but is not limited to FR4, BT, resin, epoxy or other suitable materials.

Referring to FIG. 2B, a semiconductor device package 1 is disposed on the first substrate 20. The semiconductor device package 1 is electrically connected to the first substrate 20. The semiconductor device package 1 has a surface 10A bonded to a first surface 20A of the first substrate 20. The protection element 13 has a side surface or lateral surface (not denoted in FIG. 2B, which is opposite to the surface 131 or 132) in contact with the substrate 20. The conductive via 101a may be bonded to a conductive trace/pad/via of the first substrate 20.

Referring to FIG. 2BA, a support structure 201, resembling an area of a "T" shape, is formed over the first surface 20A of the first substrate 20. In some embodiments, several conductive bumps 202 are disposed adjacent to the support structure prior to the bonding of the semiconductor device package 1 to the first substrate 20. The support structure 201 can be composed of non-conductive paste which can be solidified by a curing operation. The shape of the support structure 201 is not limited to a "T" shape. Any shape that effectively supports a protection element 13 from being inclined is within the contemplated scope of the present disclosure. Although not illustrated in FIG. 2BB, it can be appreciated that the conductive bumps 202 may not protrude from the first surface 20A of the first substrate 20. For example, solder balls of various diameters can be selected to pair with a solder resist having a predetermined thickness. Solder balls can be placed in a recess in the solder resist. Solder resist is disposed on the first surface 20A. In other words, the solder balls may partially protrude from the first surface 20A or not protrude from the first surface 20A.

Referring to FIG. 2BB, the semiconductor device package 1 is bonded to the first substrate 20 at a surface 10A. The conductive vias 101 at the corners of the second substrate 10 are electrically connected to the conductive bumps 202 and allow for electrical connection between the first substrate 20 and the second substrate 10. In some embodiments, the protection element 13 can weigh more than the second substrate 10 and cause the semiconductor device package 1 to tilt toward the protection element side (see FIG. 2BC). The tilting of the semiconductor device package 1 can alter the light emission direction. To alleviate such tilting problem, in some embodiments, a support structure 201 is formed with a proper thickness and shape supporting a side of the protection element 13 facing the first substrate 20. In some embodiments, the support structure 201 is formed with a proper thickness and shape supporting a side of the protection element 13 facing the first substrate 20 as well as the surface 10A of the second substrate 10.

Referring to FIG. 2BC, a bottom side of the protection element 13 is supported by the support structure 201 so as to prevent leftward tilting of the semiconductor device package 1.

Referring to FIG. 2C, a housing 14 is disposed on or attached to the first substrate 20. The housing 14 is disposed to surround the semiconductor device package 1 on the first substrate 20. The housing 14 defines a space to accommodate or receive the semiconductor device package 1. The housing 14 is not in contact with the semiconductor device package 1. Instead, an inner surface of the housing 14 is separated from the semiconductor device package 1. Alternatively, the housing 14 has an opening over the light-emitting surface 121 by a distance.

The optical lid 15 comprises a transparent material. The optical lid 15 comprises an optical lens 151. The optical lid 15 is disposed over the first surface 20A of the first substrate 20, as well as over the light-emitting surface 121 of the light source 12. The optical lid 15 is disposed on the housing 14. The optical lid 15 is supported by the housing 14. The optical lid 15 is disposed over the semiconductor device package 1. The optical lid 15 is separated from the semiconductor device package 1 by a distance. The optical lens 151 is disposed over the semiconductor device package 1. The optical lens 151 is disposed over the light-emitting surface 121. The optical lens 151 is disposed over the surface 132. Light emitted from the light-emitting surface 121 may pass through the surface 132 and arrive at the optical lens 151. The light-emitting surface 121, the surface 132 and the optical lens 151 may be aligned with one another. In some embodiments, the optical lens 151 is a collimation lens configured to collimate the light emitting from the light source 12.

Figure 3:
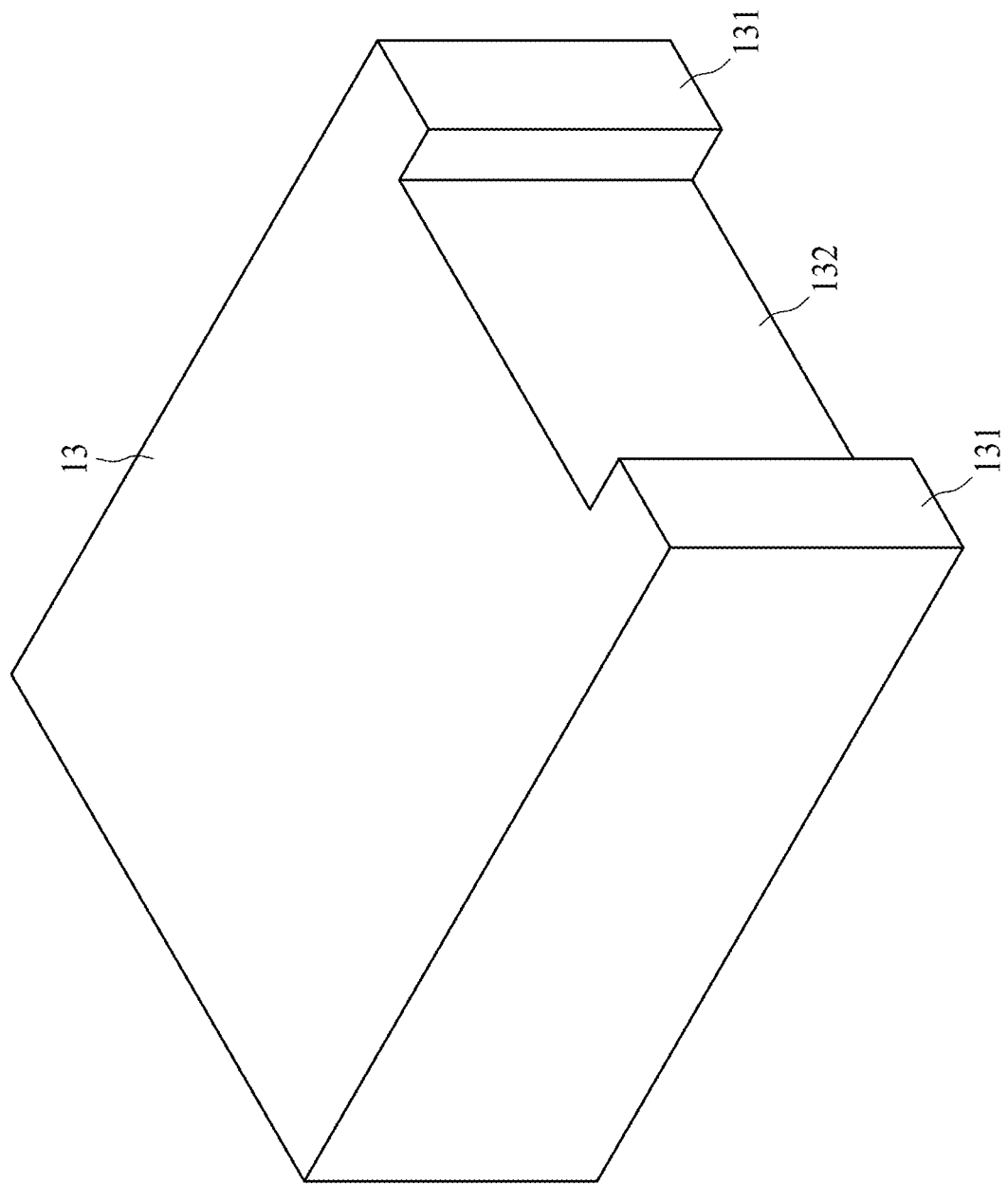
FIG. 3 illustrates a protection element in accordance with some embodiments of the present disclosure.

FIG. 3 illustrates a protection element 13 in accordance with some embodiments of the present disclosure. The protection element 13 includes a protrusion structure having a surface 131 and a surface 132. The surface 132 is recessed from the surface 131. The surface 131 is protruded from the surface 132. The surface 131 is above or higher than the surface 132. The surface 132 is lower than the surface 131. The surface 132 may have a surface roughness (Ra) smaller than approximately 0.1 or smaller than a surface roughness (Ra) of the surface 131. The protection element 13 may include but is not limited to, for example, silicone, transparent epoxy, transparent molding compound/encapsulant (which may include e.g. resin and fillers/particles), glass or other transparent materials. The protection element 13 is spaced from the light source 12. The protection element 13 is separated from the light source 12 by a distance. The protection element 13 is separated from the light-emitting surface 121 of the light source 12 by a distance. The protection element 13 includes transparent material (e.g. silicone) having a refractive index equal to or less than approximately 1.4 measured with a wavelength of approximately 1650 nm. The protection element 13 includes transparent material (e.g. silicone) having a transmittance equal to or greater than approximately 80% measured with a wavelength of approximately 1650 nm. The protection element 13 includes transparent material (e.g. glass) having a refractive index equal to or less than approximately 1.45 measured with a wavelength of approximately 1650 nm. The protection element 13 includes transparent material (e.g. glass) having a transmittance equal to or greater than approximately 90% measured with a wavelength of approximately 1650 nm. Light emitted from the light-emitting surface 121 may pass through the surface 132. The light-emitting surface 121 is disposed adjacent to the surface 132.

Figure 3A:
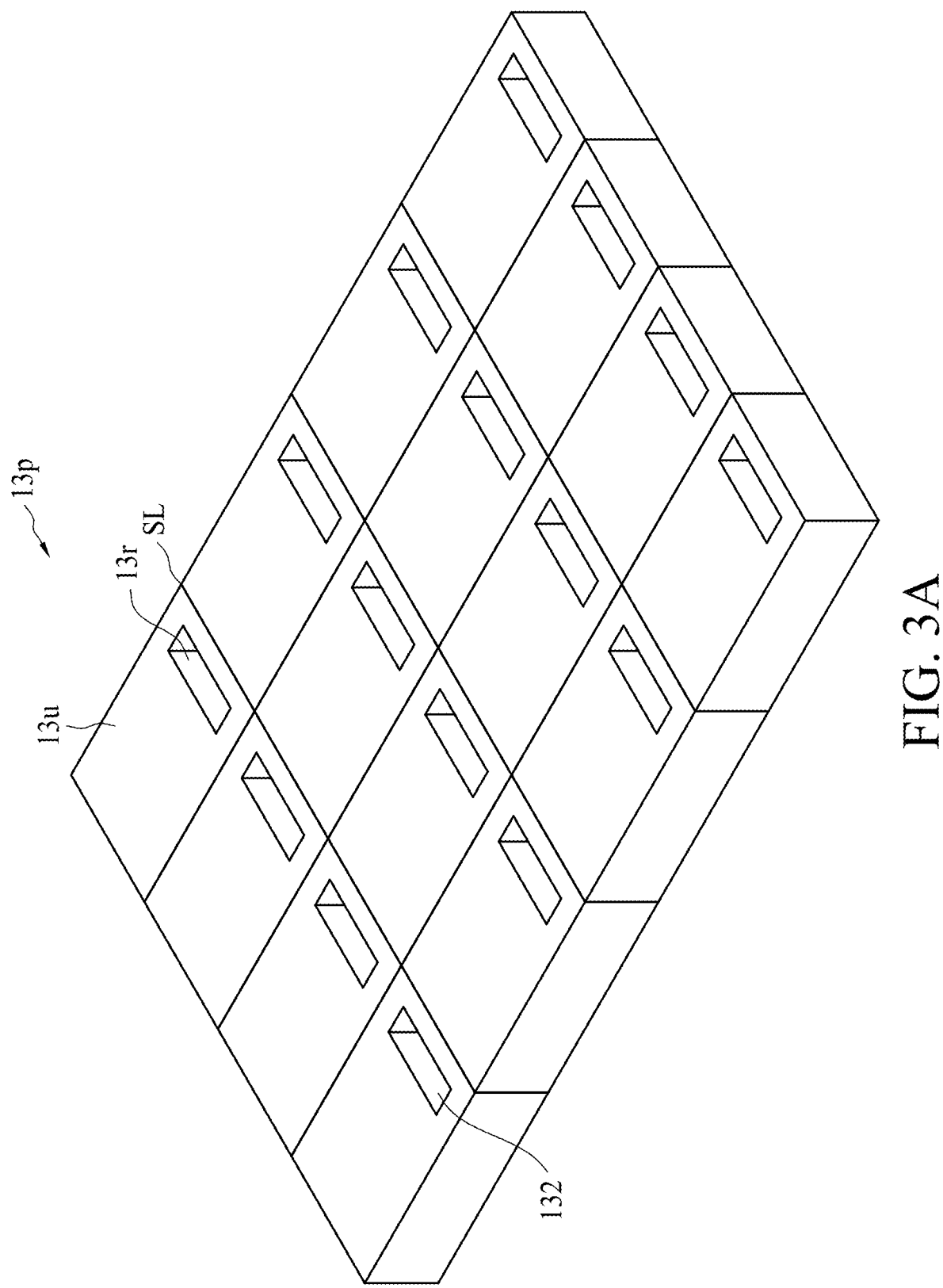
FIG. 3A, FIG. 3B, and FIG. 3C illustrate perspective views of a dicing of a protection element, according to an aspect of the present disclosure.
Figure 3B:
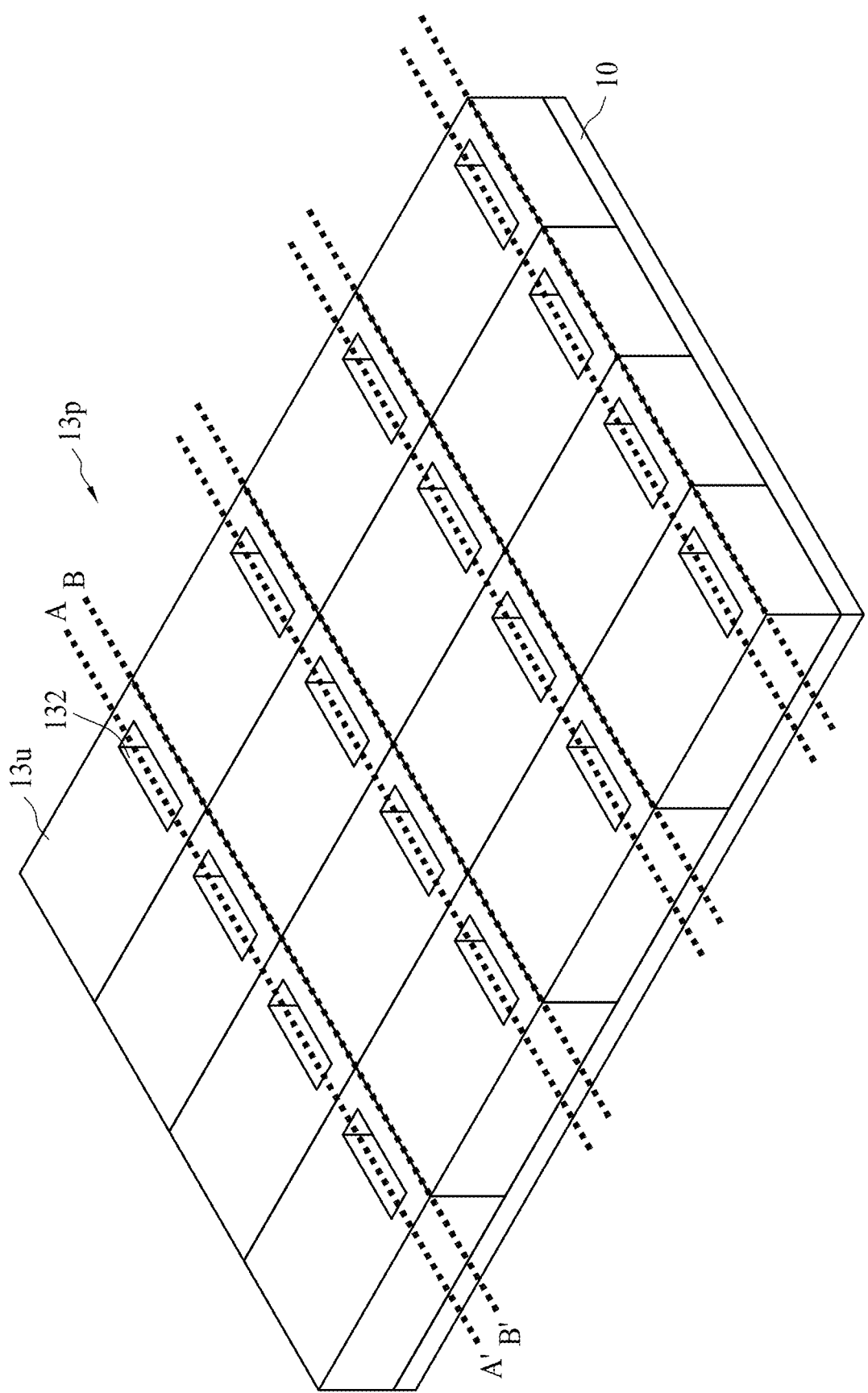
Figure 3C:
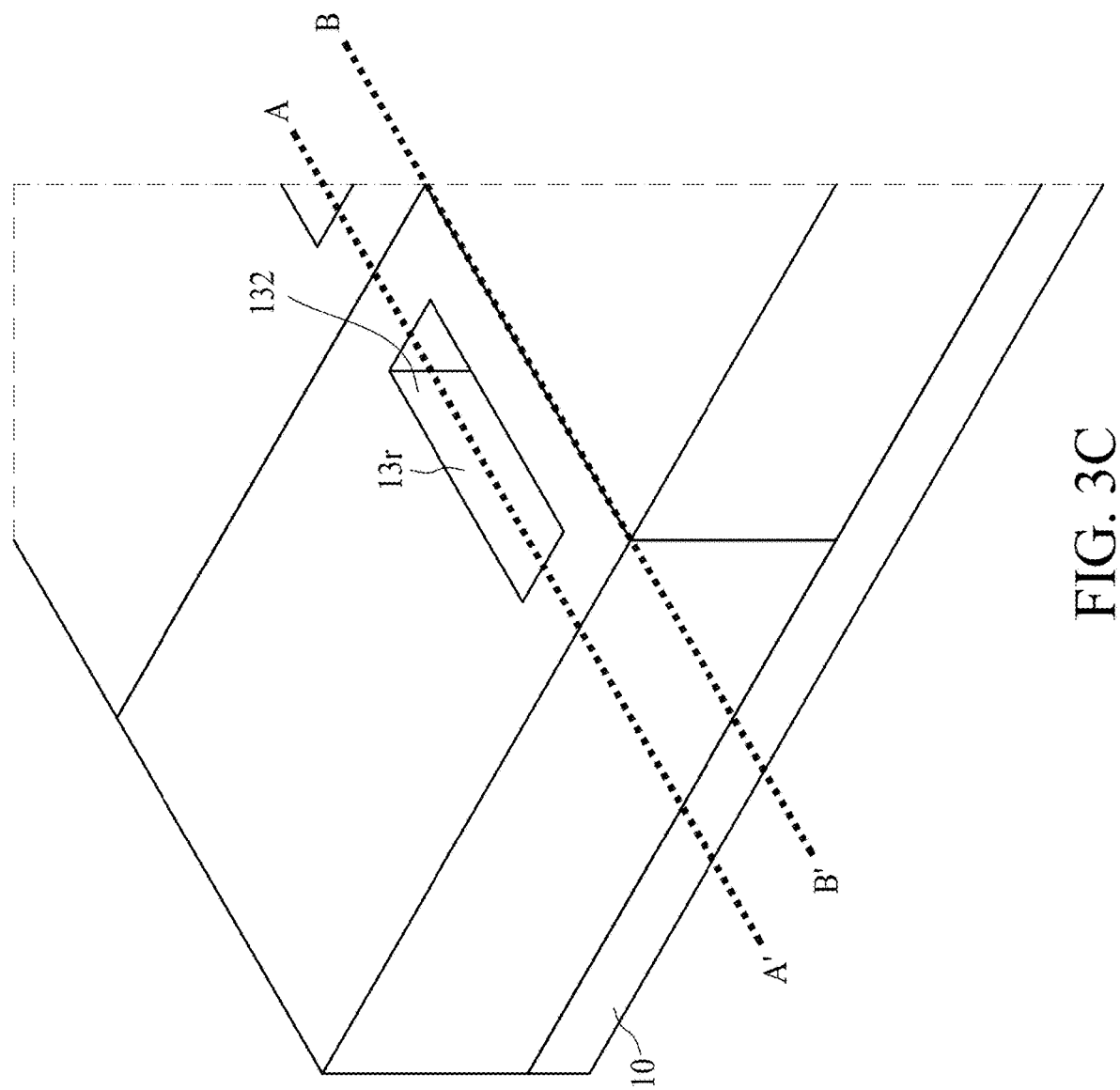

FIG. 3A, FIG. 3B, and FIG. 3C are perspective views of a semiconductor structure fabricated at various stages, in accordance with some embodiments of the present disclosure. Various figures have been simplified for a better understanding of the aspects of the present disclosure.

Referring to FIG. 3A, a panel 13p of protection element units 13u is provided. The panel 13p includes a number of protection element units 13u. The panel 13p has a number of scribe lines SL. Each of the protection element units 13u of the panel 13p has a recess 13r or a trench 13r. The panel 13p may be formed by injection molding technique.

Referring to FIG. 3B, the panel 13p of protection element units 13u is attached to or disposed on a semiconductor structure similar to the semiconductor structure as illustrated and described with reference to FIG. 1C. The panel 13p of protection element units 13u is attached to or disposed on a panel of substrate units 10 on which a number of light sources 12 are disposed. The panel 13p of protection element units 13u is attached to or disposed on a panel of substrate units 10 on which a number of interposers 13 are disposed. A line AA' is shown across the panel 13p of protection element units 13u. A line BB' is shown across the panel 13p of protection element units 13u. The line AA' may be shown across the recess 13r of each of the protection element units 13u. The line BB' may be overlapped with the scribe line SL. The line AA' may be substantially parallel to the line BB'. A distance between the line AA' and the line BB' may be substantially equal to a width of a blade used in a singulation or sawing operation. A singulation or sawing operation is performed to form a number of semiconductor device packages 1 as illustrated and described with reference to FIG. 1.

Referring to FIG. 3C, an enlarged view of a part of the structure is illustrated and described with reference to FIG. 3B. A portion of the panel 13p of protection element units 13u between the line AA' and the line BB' may be removed by the blade. A portion of the panel of the substrate units 10 between the line AA' and the line BB' may be removed by the blade. A portion of each of the protection element units 13u between the line AA' and the line BB' may be removed by a blade to form a protection element 13 as illustrated and described with reference to FIG. 3. Arrangement or design of the recess 13r may help in preventing the light-emitting surface 121 from being damaged while performing the singulation or sawing operation in consideration of the width of the blade or misalignment of the blade. In some embodiments, the surface roughness (Ra) of the inner surface of the recess 13r is determined at the completion of demolding. A surface roughness (Ra) about or lower than 0.1 is desired in some embodiments of the present disclosure.

Figure 4:
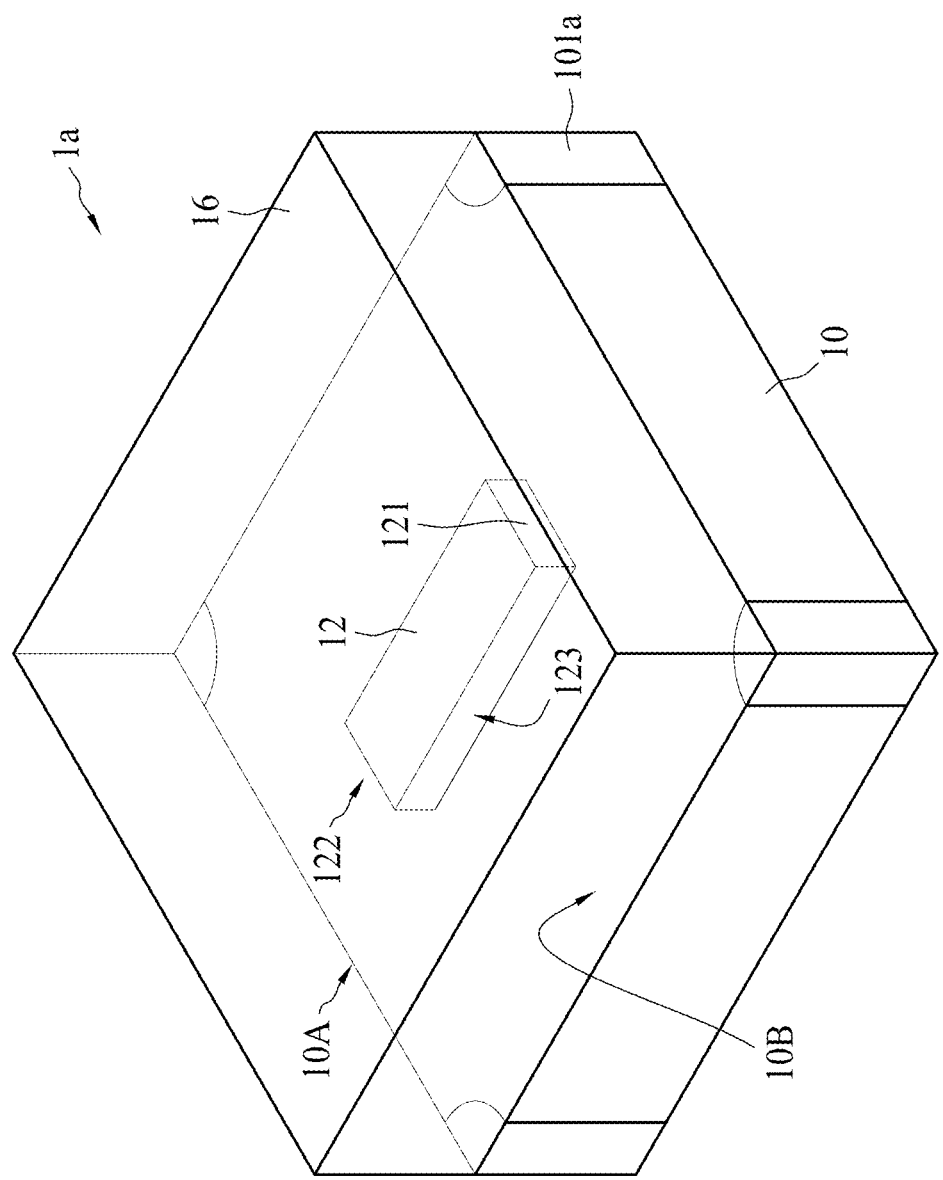
FIG. 4 illustrates a perspective view of a semiconductor package structure, according to an aspect of the present disclosure.

FIG. 4 illustrates a semiconductor device package 1a in accordance with some embodiments of the present disclosure. The semiconductor device package 1a shown in FIG. 4 includes a second substrate 10, a light source 12 and a protection element 16.

The second substrate 10 includes a circuitry structure (not shown in FIG. 4). The second substrate 10 may include conductive traces, pads and/or vias (not shown in FIG. 4). The second substrate 10 has a number of conductive vias 101a. The second substrate 10 may include but is not limited to FR4, BT, resin, epoxy or other suitable materials.

The light source 12 may include but is not limited to a light-emitting diode (LED), a vertical-cavity surface-emitting laser (VCSEL), a semiconductor laser diode with laser beam emission perpendicular from the top surface or an edge-emitting semiconductor laser diode (also an in-plane laser diode). The light source 12 includes an edge-emitting semiconductor laser diode (also in-plane laser diode). The light source 12 includes a light-emitting surface 121. The light source 12 may emit light at a wavelength of approximately 1650 nm but can be varied or changed in other embodiments of the subject application. The light source 12 may emit approximately 1650 nm wavelength band light but can be varied or changed in other embodiments of the subject application. The light source 12 is disposed on the second substrate 10. The light source 12 is electrically connected to the second substrate 10.

The protection element 16 is disposed on the second substrate 10. The protection element 16 is disposed on the light source 12. The protection element 16 encapsulates the light source 12. The protection element 16 protects the light source 12 from being damaged during the manufacturing process. The protection element 16 covers the second substrate 10. The protection element 16 covers the light source 12. The protection element 16 covers the conductive vias 101a.

The protection element 16 may include but is not limited to, for example, silicone, transparent epoxy, transparent molding compound/encapsulant (which may include e.g. resin and fillers/particles), glass or other transparent materials. The semiconductor device package 1a includes a molded-type semiconductor device package. The protection element 16 includes transparent material (e.g. mold compound/encapsulant) having a refractive index equal to or greater than approximately 1.5 measured at a wavelength of approximately 1650 nm. The protection element 16 includes transparent material (e.g. mold compound/encapsulant) having a transmittance smaller than approximately 40% measured at a wavelength of approximately 1650 nm. Light emitted from the light-emitting surface 121 may pass through the protection element 16. In some embodiments, the protection element 16 is in contact with the light source 12.

Figure 4A:
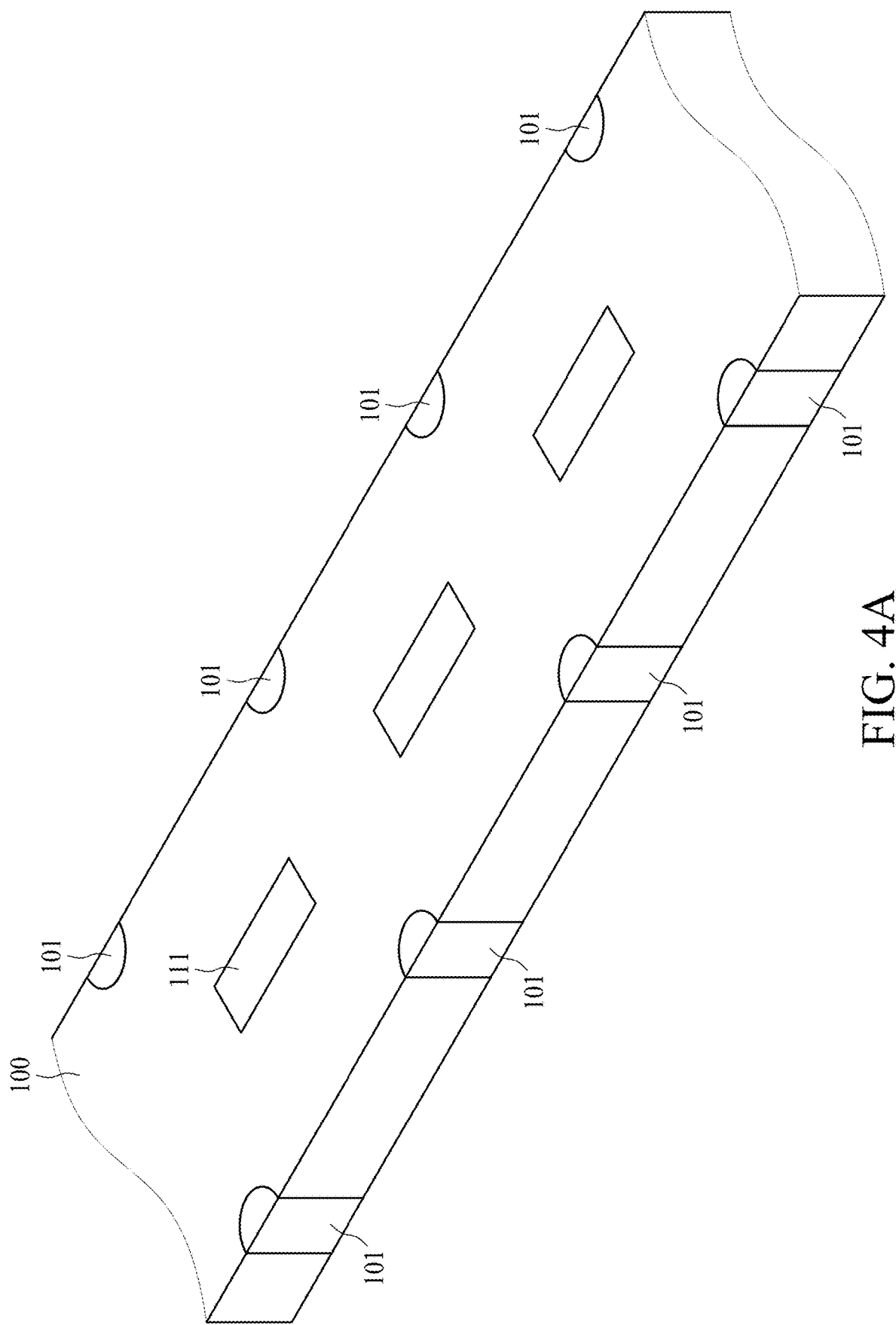
FIG. 4A, FIG. 4B, and FIG. 4C illustrate manufacturing operations of a semiconductor package structure during intermediate stages, according to an aspect of the present disclosure.
Figure 4B:
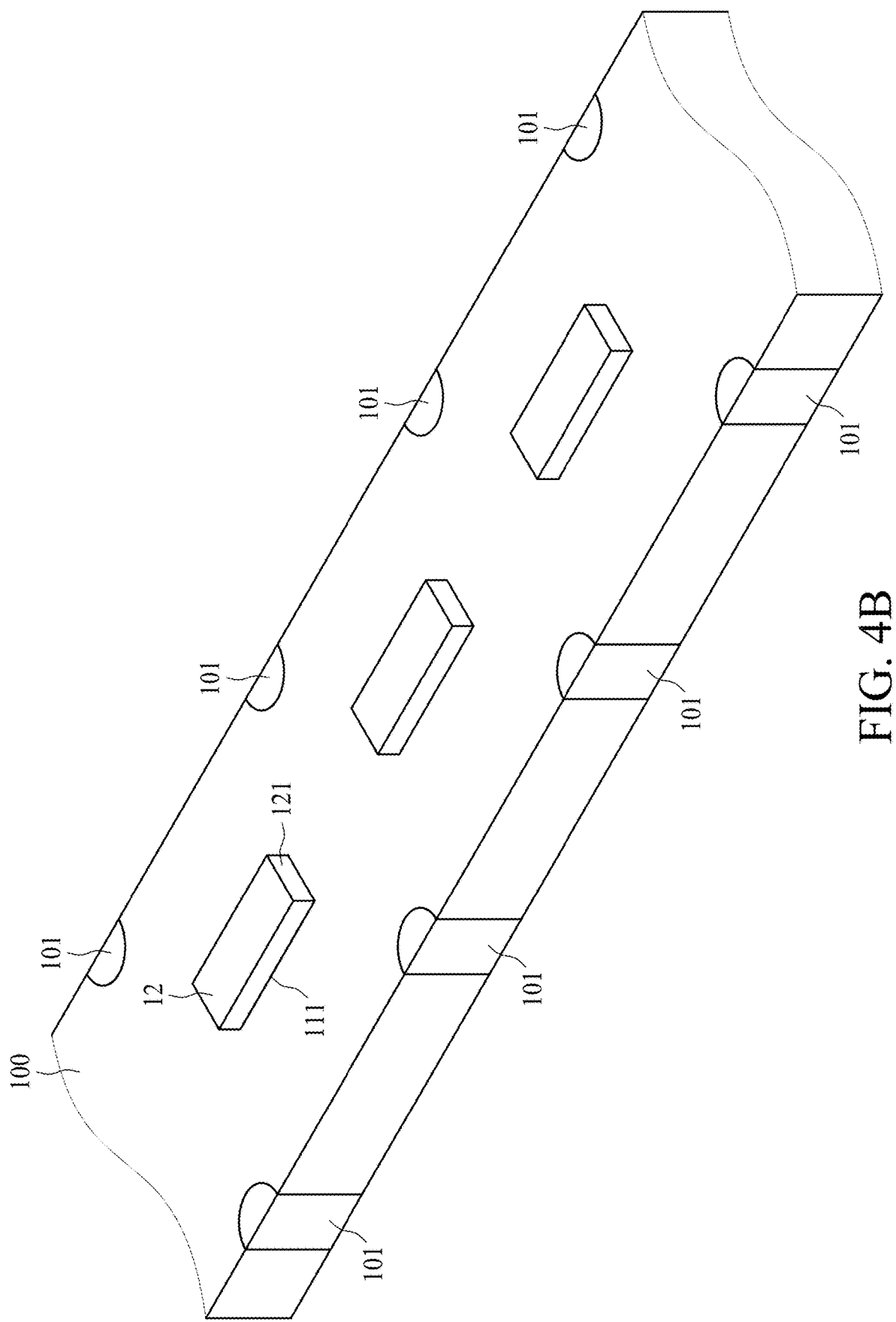
Figure 4C:
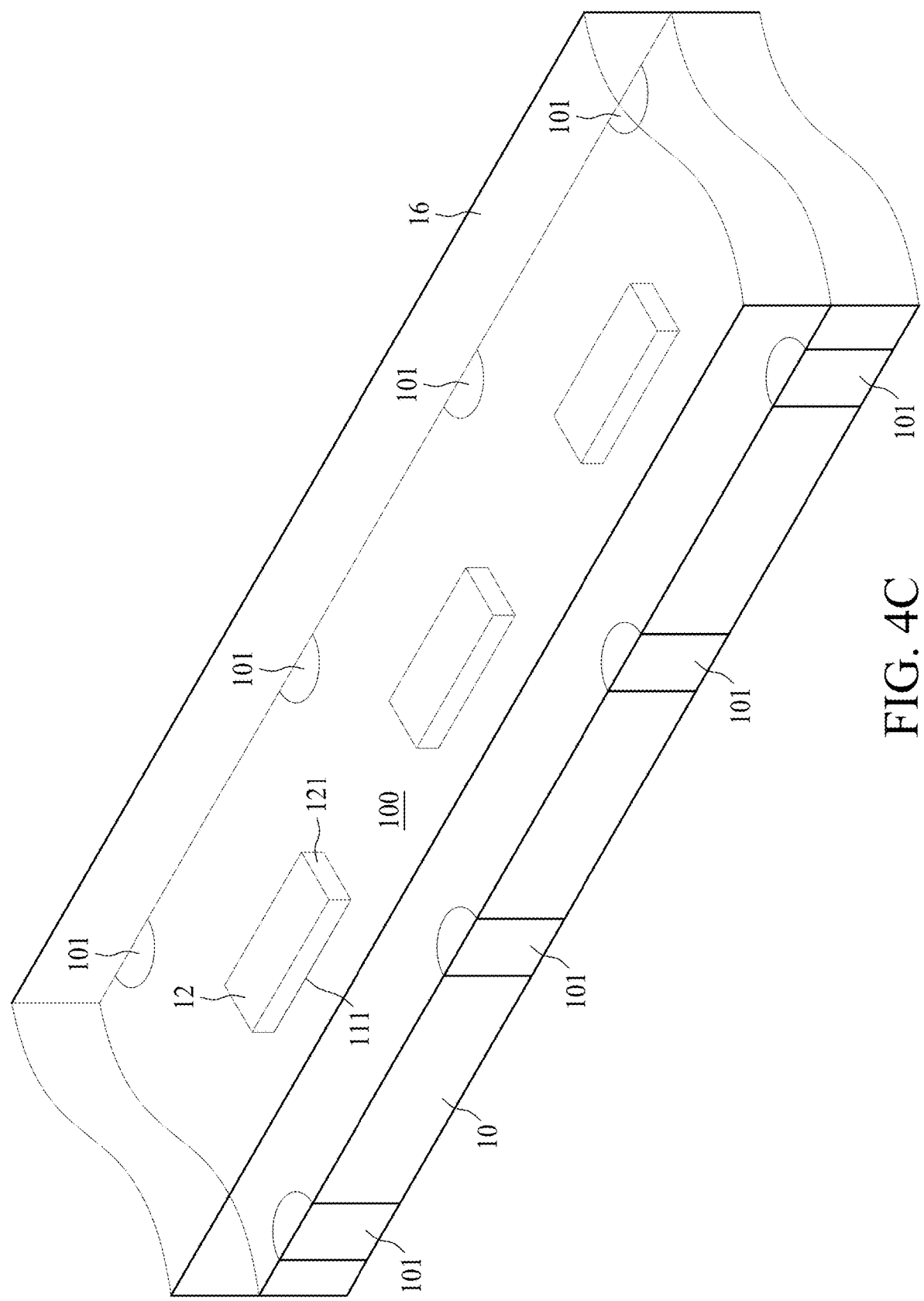

FIG. 4A, FIG. 4B and FIG. 4C are cross-sectional views of a semiconductor structure fabricated at various stages, in accordance with some embodiments of the present disclosure. Various figures have been simplified for a better understanding of the aspects of the present disclosure.

Referring to FIG. 4A, a strip of substrate units 100 is provided. The strip of substrate units 100 may include a number of substrate units 10. A number of conductive through vias 101 are formed in the strip of substrate units 10. Each of the substrate units 100 comprises a circuitry structure (not shown in FIG. 4A). Each of the substrate units 100 may include conductive traces, pads and/or vias (not shown in FIG. 4A). Each of the substrate units 100 may have a number of conductive vias 101. The strip of substrate units 100 may include but is not limited to FR4, BT, resin, epoxy or other suitable materials. Although it is not illustrated in FIG. 4A, it is contemplated that a layer of nickel (Ni) and/or a layer of gold (Au) may be formed on the conductive vias 101 to facilitate connection. Although it is not illustrated in FIG. 4A, it is contemplated that a panel of substrate units may replace the strip of substrate units 100. Each of the substrate units 100 may include an area 111.

Referring to FIG. 4B, a number of light sources 12 are disposed on the substrate units 10. Each of the light sources 12 is disposed on one of the substrate units 10. Each of the light sources 12 is disposed on the area 111 of one of the substrate units 10. The light source 12 may include but is not limited to a light-emitting diode (LED), a vertical-cavity surface-emitting laser (VCSEL), a semiconductor laser diode with laser beam emission perpendicular from the top surface or an edge-emitting semiconductor laser diode (also an in-plane laser diode). The light source 12 includes an edge-emitting semiconductor laser diode (also an in-plane laser diode). The light source 12 includes a light-emitting surface 121. Each of the light sources 12 is electrically connected to one of the substrate units 100. Each of the anodes and cathodes of the light source 12 is electrically connected to each of the conductive vias 101.

Referring to FIG. 4C, a protection element 16 is formed on the strip of substrate units 100. The protection element 16 may be formed by a molding technique. The protection element 16 may include but is not limited to, for example, transparent epoxy, transparent molding compound/encapsulant (which may include e.g. resin and fillers/particles) or other transparent materials. The protection element 16 encapsulates the light source 12. The protection element 16 includes transparent material (e.g. molding compound/encapsulant) having a refractive index equal to or greater than approximately 1.5 measured at a wavelength of approximately 1650 nm. The protection element 16 includes transparent material (e.g. molding compound/encapsulant) having a transmittance less than approximately 40% measured at a wavelength of approximately 1650 nm. Light emitted from the light-emitting surface 121 may pass through the protection element 16. The light-emitting surface 121 is disposed adjacent to an edge of each of the substrate units 100. A singulation or sawing operation is performed to form a number of semiconductor device packages 1a as illustrated and described with reference to FIG. 4.

Figure 5:
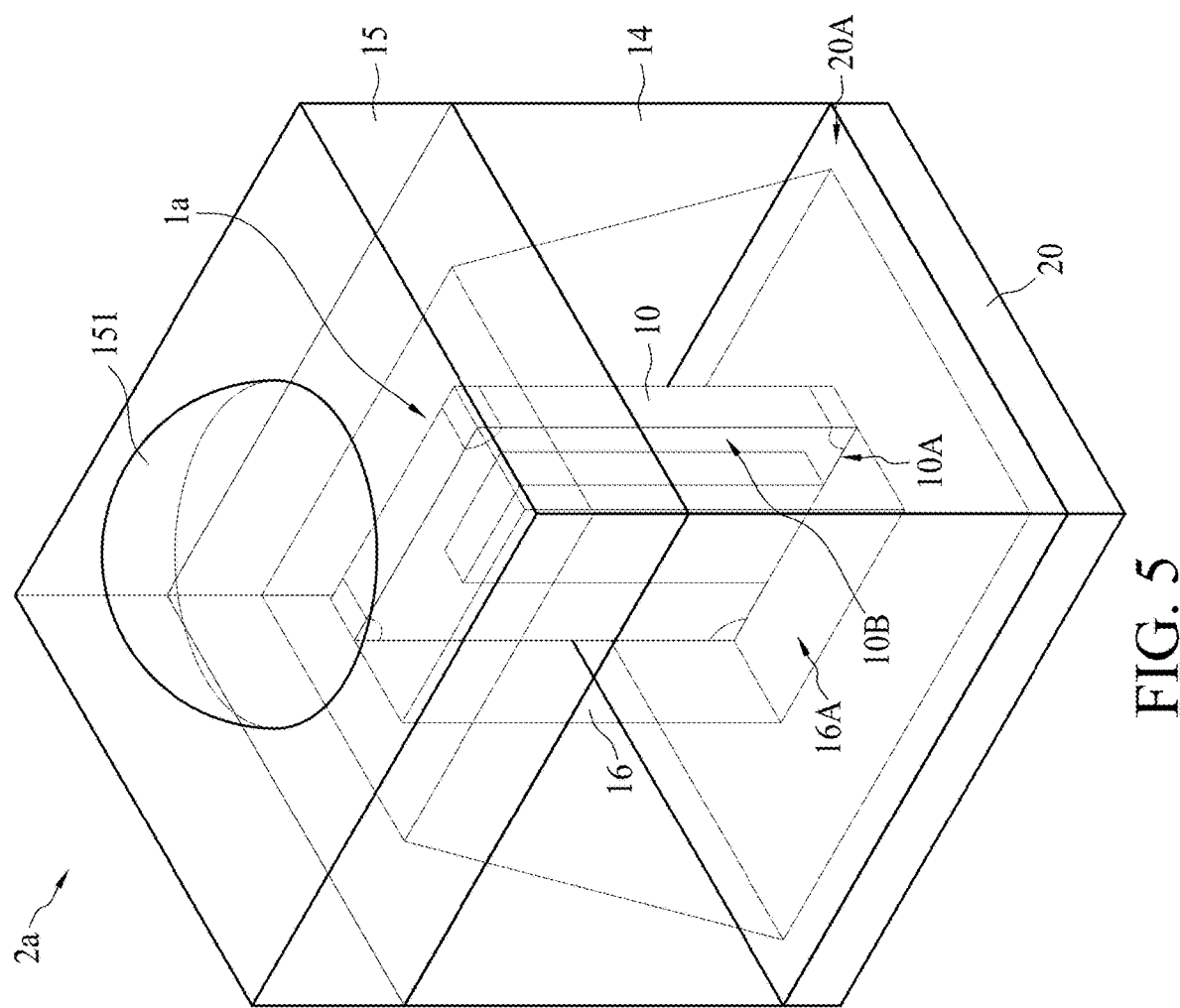
FIG. 5 illustrates a perspective view of an optical package structure, according to an aspect of the present disclosure.

FIG. 5 illustrates an optical package 2a in accordance with some embodiments of the present disclosure. The optical package 2a shown in FIG. 5 includes a first substrate 20, a semiconductor device package 1a, a housing 14 and an optical lid 15. As shown in FIG. 5, the light source 12 of the semiconductor device package 1a has a first projection area on the first surface 20A of the first substrate 20 and a second projection area on the second surface 10B of the second substrate 10. In some embodiments, the first projection area is smaller than the second projection area.

The first substrate 20 is similar to the second substrate 10 as illustrated and described with reference to FIG. 1. The first substrate 20 may include but is not limited to FR4, BT, resin, epoxy or other suitable materials.

The semiconductor device package 1a is the same or similar to the semiconductor device package 1a as illustrated and described with reference to FIG. 4. The semiconductor device package 1a is disposed on the substrate 20. The semiconductor device package 1a is electrically connected to the first substrate 20. The semiconductor device package 1a has a surface 10A facing the first surface 20A of the first substrate 20. The surface 10A of the second substrate 10 is bonded to the first substrate 20. The protection element 16 has a surface 16A facing and in contact with the first substrate 20.

The housing 14 is disposed on the first substrate 20. The housing 14 surrounds the semiconductor device package 1a. The housing 14 defines a space to accommodate or receive the semiconductor device package 1a. The housing 14 is not in contact with the semiconductor device package 1. Instead, an inner surface of the housing 14 is separated from the semiconductor device package 1a. Alternatively, the housing 14 has an opening over the light-emitting surface 121 by a distance.

The optical lid 15 includes transparent material. The optical lid 15 includes an optical lens 151. The optical lid 15 is disposed on the substrate 20. The optical lid 15 is disposed on the housing 14. The optical lid 15 covers the opening of the housing 14. The optical lid 15 is supported by the housing 14. The optical lid 15 is disposed over the semiconductor device package 1a. The optical lid 15 is separated from the semiconductor device package 1a by a distance. The optical lens 151 is disposed over the semiconductor device package 1a. The optical lens 151 is disposed over the light-emitting surface 121. Light emitted from the light-emitting surface 121 may pass through the protection element 16 and arrive at the optical lens 151. The light-emitting surface 121 is disposed adjacent to the optical lens 151. In some embodiments, the optical lens 151 is a collimation lens configured to collimate the light emitting from the light source 12.

Figure 5A:
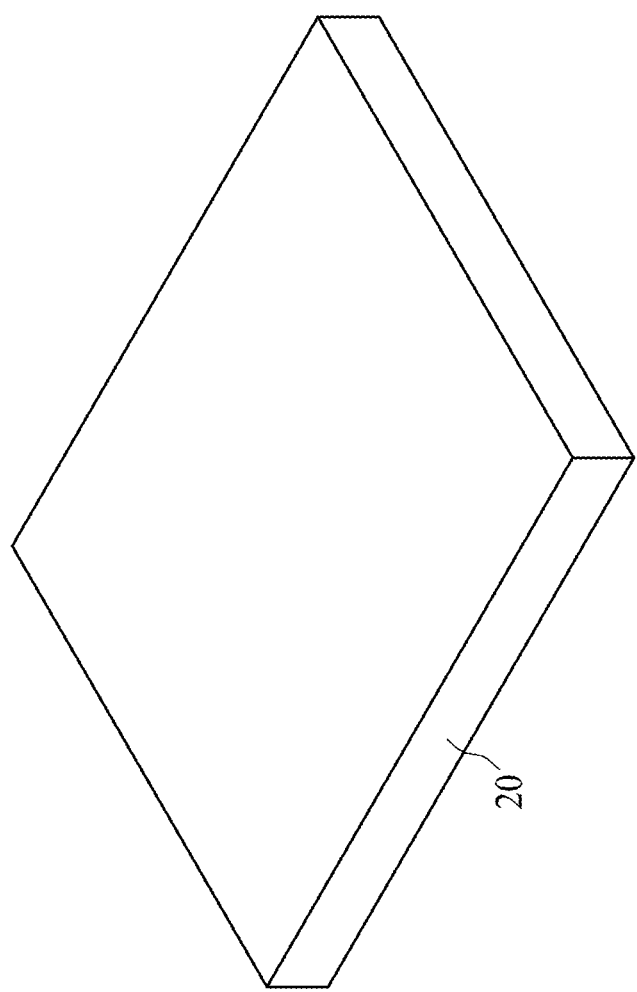
FIG. 5A, FIG. 5B, and FIG. 5C illustrate manufacturing operations of a semiconductor package structure during intermediate stages, according to an aspect of the present disclosure.
Figure 5B:
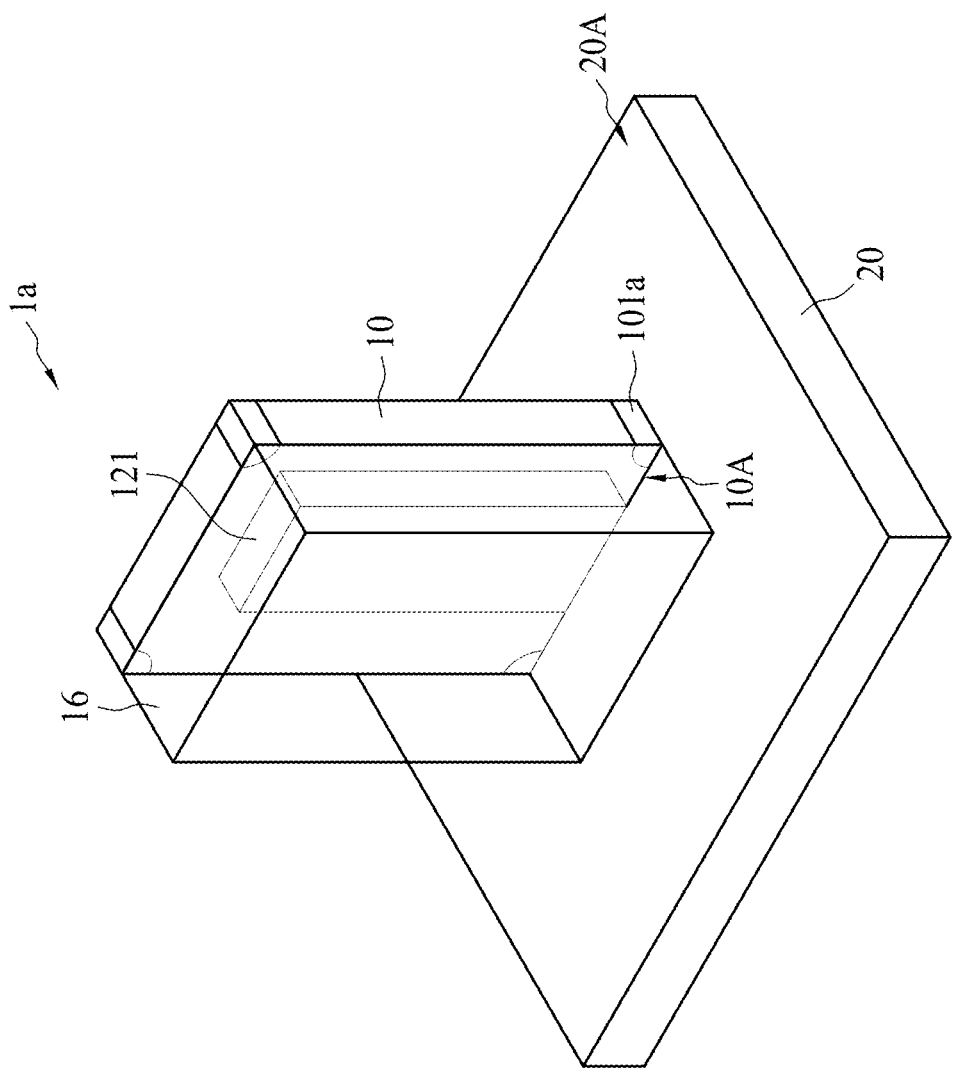
Figure 5C:
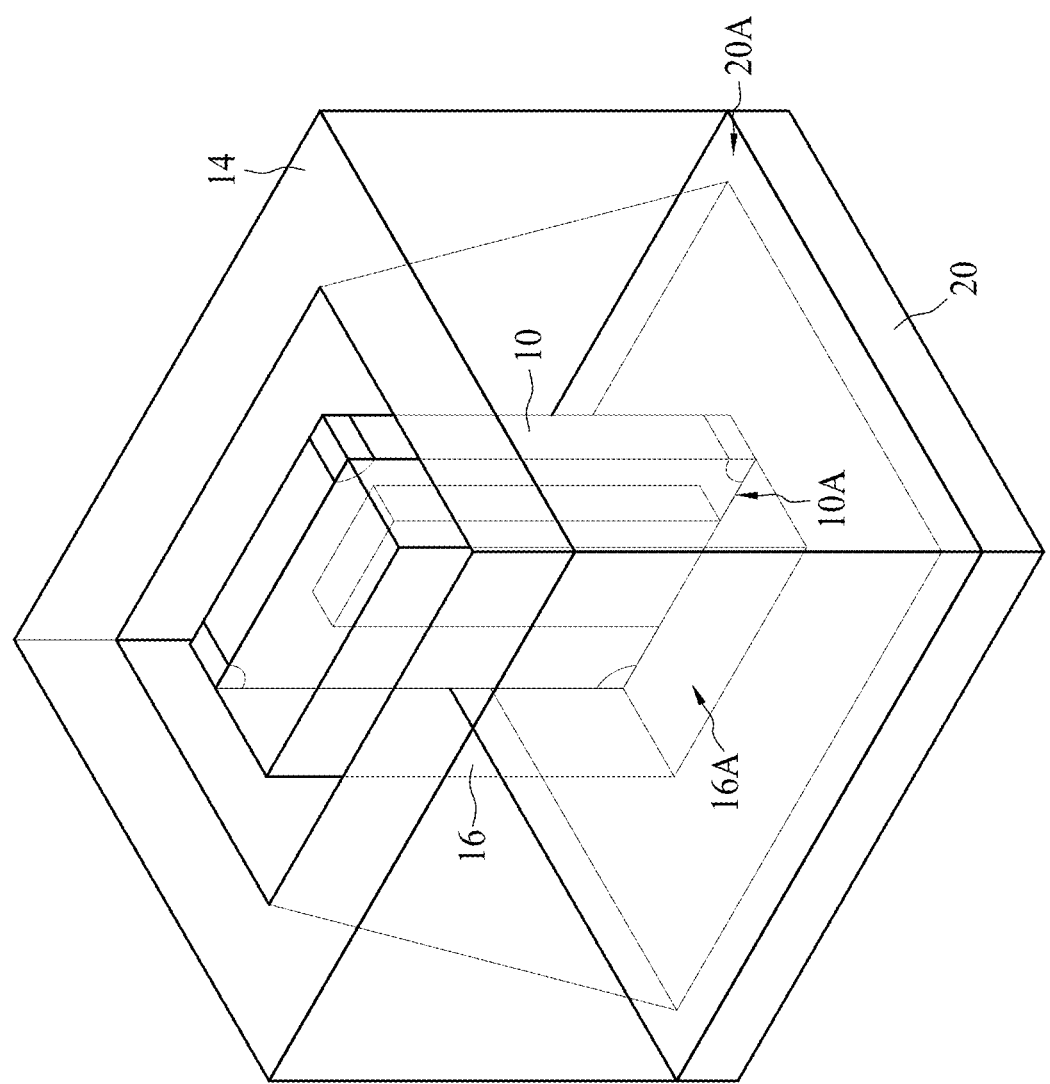

FIG. 5A, FIG. 5B, and FIG. 5C are cross-sectional views of a semiconductor structure fabricated at various stages, in accordance with some embodiments of the present disclosure. Various figures have been simplified for a better understanding of the aspects of the present disclosure.

Referring to FIG. 5A, a first substrate 20 is provided. The first substrate 20 includes a circuitry structure (not shown in FIG. 5A). The first substrate 20 may include conductive traces, pads and/or vias (not shown in FIG. 5A). The first substrate 20 may include but is not limited to FR4, BT, resin, epoxy or other suitable materials.

Referring to FIG. 5B, a semiconductor device package 1a is disposed on the first substrate 20. The semiconductor device package 1a is electrically connected to the first substrate 20. The semiconductor device package 1a has a surface 10A bonded to a first surface 20A of the first substrate 20. The protection element 16 has a side surface or lateral surface (not denoted in FIG. 5B, which is opposite to the light-emitting surface 121) in contact with the substrate 20. The conductive via 101a may be bonded to a conductive trace/pad/via of the first substrate 20.

Referring to FIG. 5C, a housing 14 is disposed on or attached to the first substrate 20. The housing 14 is disposed to surround the semiconductor device package 1a on the first substrate 20. The housing 14 defines a space to accommodate or receive the semiconductor device package 1a. The housing 14 is not in contact with the semiconductor device package 1a. Instead, an inner surface of the housing 14 is separated from the semiconductor device package 1a. Alternatively, the housing 14 has an opening over the light-emitting surface 121 by a distance.

An optical lid 15 is disposed on the housing 14 to form the semiconductor device package 2a as illustrated and described with reference to FIG. 5. The optical lid 15 includes transparent material. The optical lid 15 includes an optical lens 151. The optical lid 15 is disposed on the first substrate 20. The optical lid 15 is disposed on the housing 14. The optical lid 15 is supported by the housing 14. The optical lid 15 covers the opening of the housing 14. The optical lid 15 is disposed over the semiconductor device package 1a. The optical lid 15 is separated from the semiconductor device package 1a by a distance. The optical lens 151 is disposed over the semiconductor device package 1a. The optical lens 151 is disposed over the light-emitting surface 121. The optical lens 151 is disposed adjacent to the light-emitting surface 121.

Referring back to FIG. 2BA, FIG. 2BB, and FIG. 2BC, the support structure 201 described in FIG. 2BA, FIG. 2BB, and FIG. 2BC can be applied to support the semiconductor device package 1a and prevent the same from being tilted toward the protection element 16 side. In some embodiments, the protection element 16 may not have a surface 16A aligning with the surface 10A of the second substrate 10. A thickness of the support structure 201 can be designed to fit a gap between the surface 16A of the protection element 16 and the first surface 20A of the first substrate 20, so as to prevent the semiconductor device package 1a from being tilted.

Figure 6A:
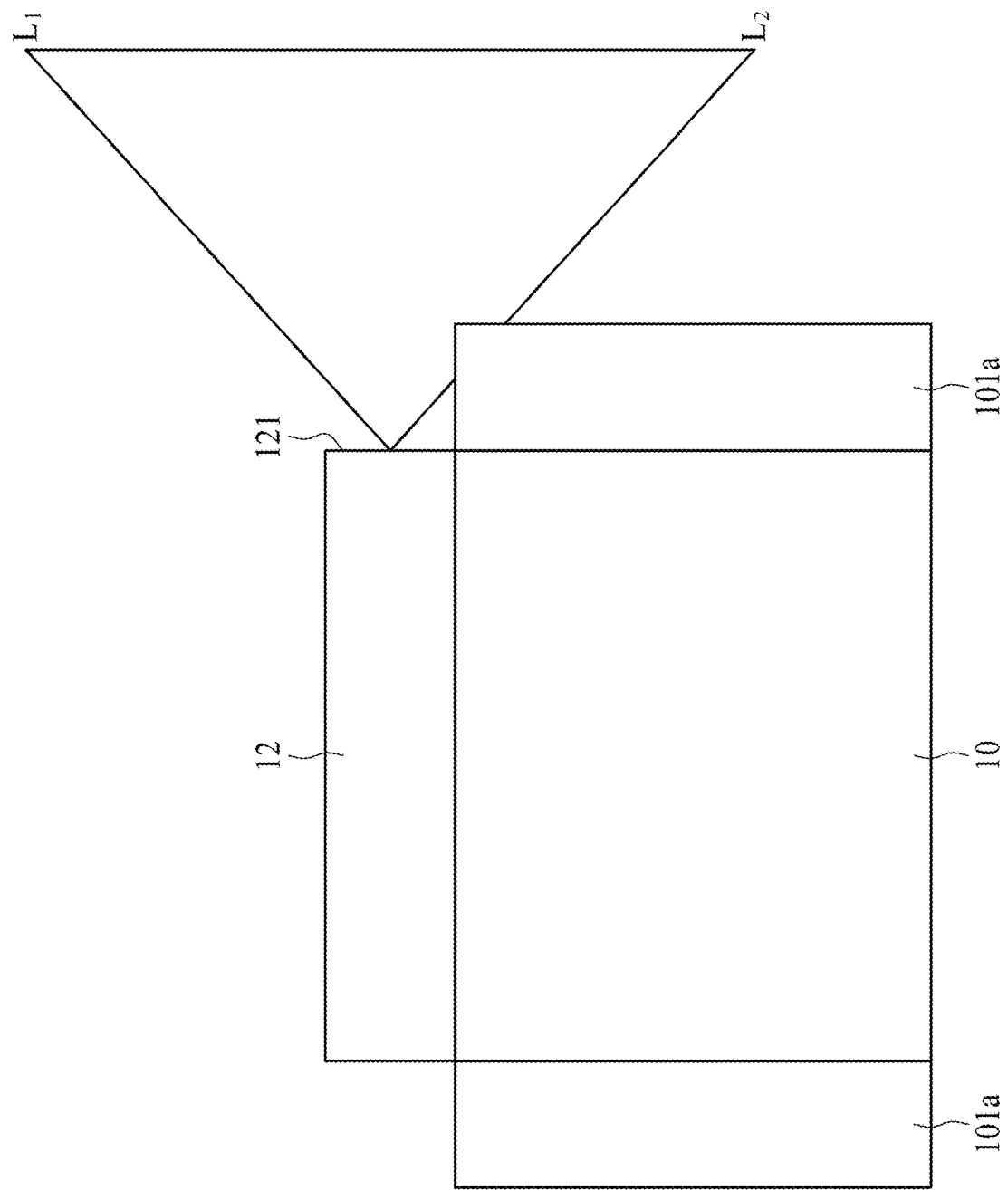
FIG. 6A is a cross sectional view of a semiconductor package structure, according to an aspect of the present disclosure.

FIG. 6A illustrates an enlarged view of the semiconductor device package 1a as shown in FIG. 4. The light beam L2 emitted from the light emitting surface 121 of the light source 12 may be blocked by an edge, a periphery, or a conductive via of the second substrate 10. Although it is not illustrated in FIG. 6A, it is contemplated that light beams other than L2 may be blocked by the second substrate 10. The same arrangement can be applied to the semiconductor device package 1 as shown in FIG. 1.

Figure 6B:
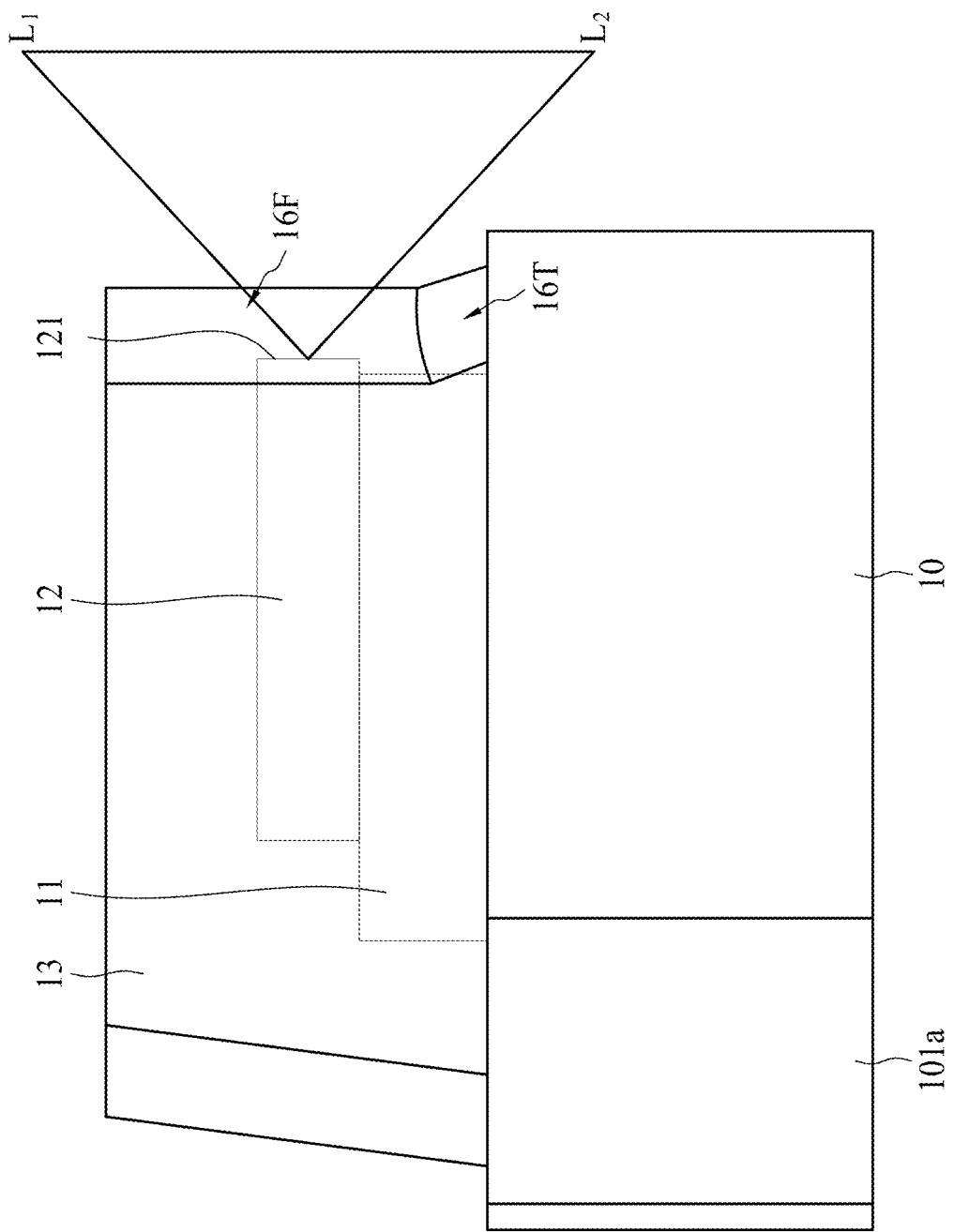
FIG. 6B is a cross sectional view of a semiconductor package structure, according to an aspect of the present disclosure.

FIG. 6B illustrates an enlarged view of the semiconductor device package 1a as shown in FIG. 4. The light beams L1 and L2 emitted from the light emitting surface 121 of the light source 12 may not be blocked by the second substrate 10. With the interposer 11 stacked between the light source 12 and the second substrate 10, the elevation of the light source 12 is lifted or increased, and the light beams L1 and L2 emitted from the light emitting surface 121 of the light source 12 may not be blocked by an edge, a periphery, or a conductive via 101a of the second substrate 10. Note in FIG. 6B, the light-emitting surface 121 is protruded from a side of the interposer 11. The same arrangement can be applied to the semiconductor device package 1 as shown in FIG. 1.

Figure 6C:
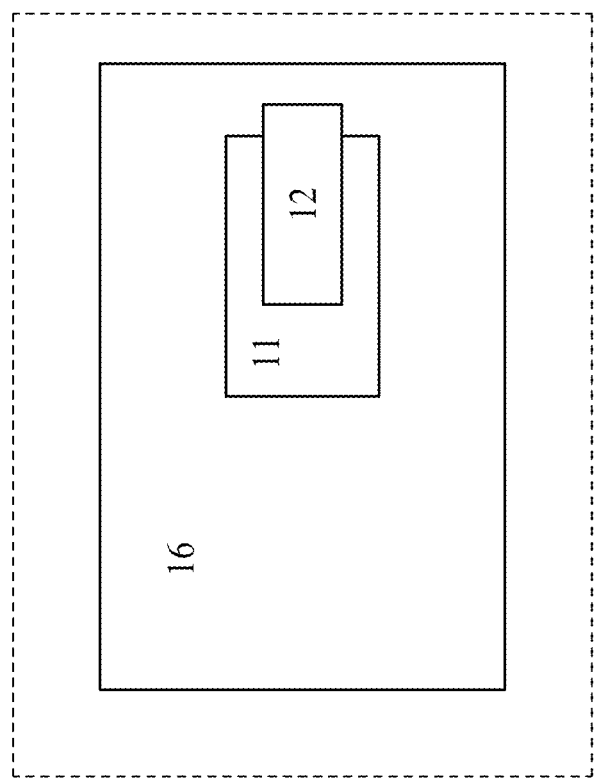
FIG. 6C is a top view of a semiconductor package structure, according to an aspect of the present disclosure.

In FIG. 6B, the protection element 16 includes a surface 16F adjacent to the light-emitting surface 121 and a surface 16T protruded from the surface 16F. The surface 16F is a substantially vertical surface. The surface 16T is a slanted surface tapering from the second substrate 10 toward the light source 12. The surface 16T is slanted to foster a demolding operation. In some embodiments, the slanted surface 16T may reside at beyond the side parallel to the light-emitting surface 121. For example, referring to FIG. 6C, a top view of the semiconductor device package 1a is illustrated. A top surface of the protection element 16 is shown in solid line, and a bottom surface of the protection element 16 is shown in dotted lines. In some embodiments, the slanted surface 16T can be disposed on four sides of the protection element 16, in order to facilitate the demolding operation.

Figure 8:
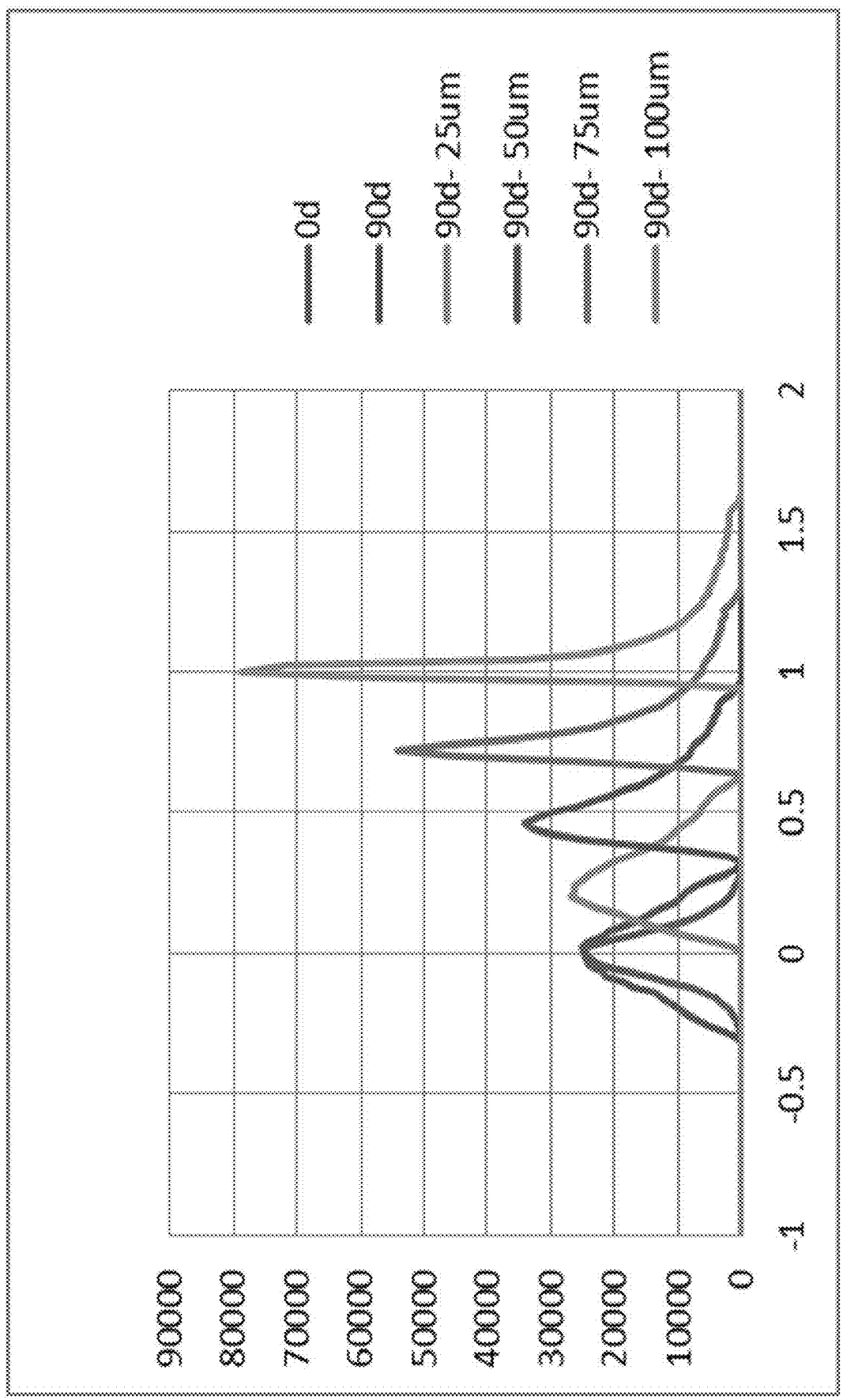
FIG. 8 shows a simulation result of a semiconductor package structure, in accordance with some embodiments of the present disclosure.

FIG. 7A illustrates a simulation result of the semiconductor device package 2a (molding type package) in accordance with some embodiments of the present disclosure. Referring to FIG. 7A, light intensity is simulated on an X-Y plane at a distance of approximately 30 centimeters (cm) from the optical lens 151. The chart below shows intensity distribution along the X-axis. The chart on the side shows intensity distribution along the Y-axis FIG. 7B illustrates a simulation result of the semiconductor device package 2a (molding type package) in accordance with some embodiments of the present disclosure. Referring to FIG. 7B, light intensity is simulated on an X-Y plane at a distance of approximately 60 centimeters (cm) from the optical lens 151. The chart below shows intensity distribution along the X-axis. The chart on the side shows intensity distribution along the Y-axis FIG. 7C illustrates a simulation result of the semiconductor device package 2a (molding type package) in accordance with some embodiments of the present disclosure. Referring to FIG. 7C, light intensity is simulated on an X-Y plane at a distance of approximately 90 centimeters (cm) from the optical lens 151. The chart below shows intensity distribution along the X-axis. The chart on the side shows intensity distribution along the Y-axis FIG. 8 illustrates a simulation result of the semiconductor device package 2a (molding type package) in accordance with some embodiments of the present disclosure. Referring to FIG. 8, light intensity is measured or simulated on an X-Y plane (with 5×5 mm² area). Optical efficiency is approximately 55.6% or 0.556. The line denoted "0d" shows the intensity simulated along the Y-axis. The line denoted "90d" shows the intensity simulated along the X-axis. The line denoted "90d-25 μm" shows the intensity simulated in a case that a misalignment resulted from the bonding operation of approximately 25 μm in the semiconductor device package 2a. The line denoted "90d-50 μm" shows the intensity simulated in a case that a misalignment resulted from the bonding operation of approximately 50 μm in the semiconductor device package 2a. The line denoted "90d-75 μm" shows the intensity simulated in a case that a misalignment resulted from the bonding operation of approximately 75 μm in the semiconductor device package 2a. The line denoted "90d-100 μm" shows the intensity simulated in a case that a misalignment resulted from the bonding operation of approximately 100 μm in the semiconductor device package 2a.

Figure 9B:
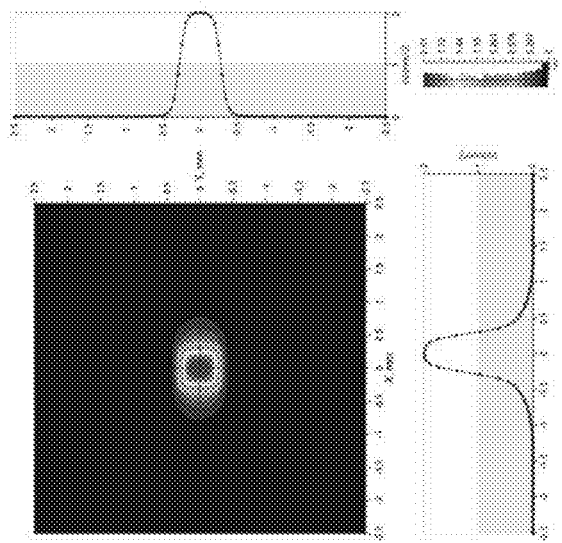
FIG. 9A, FIG. 9B, and FIG. 9C show various simulation results of a semiconductor package structure, in accordance with some embodiments of the present disclosure.
Figure 9C:
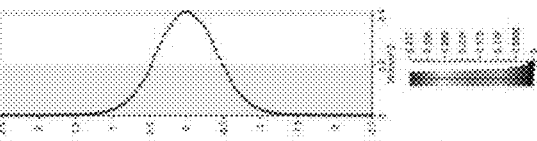
Figure 9C:
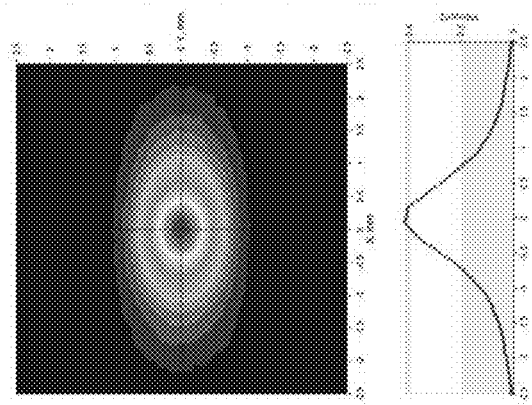
Figure 9A:
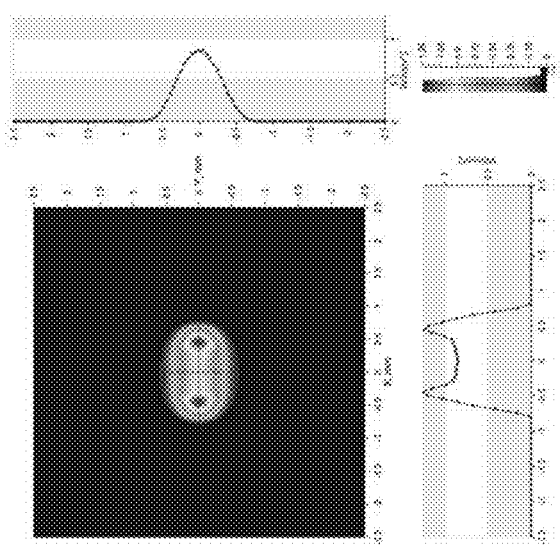
Figure 10:
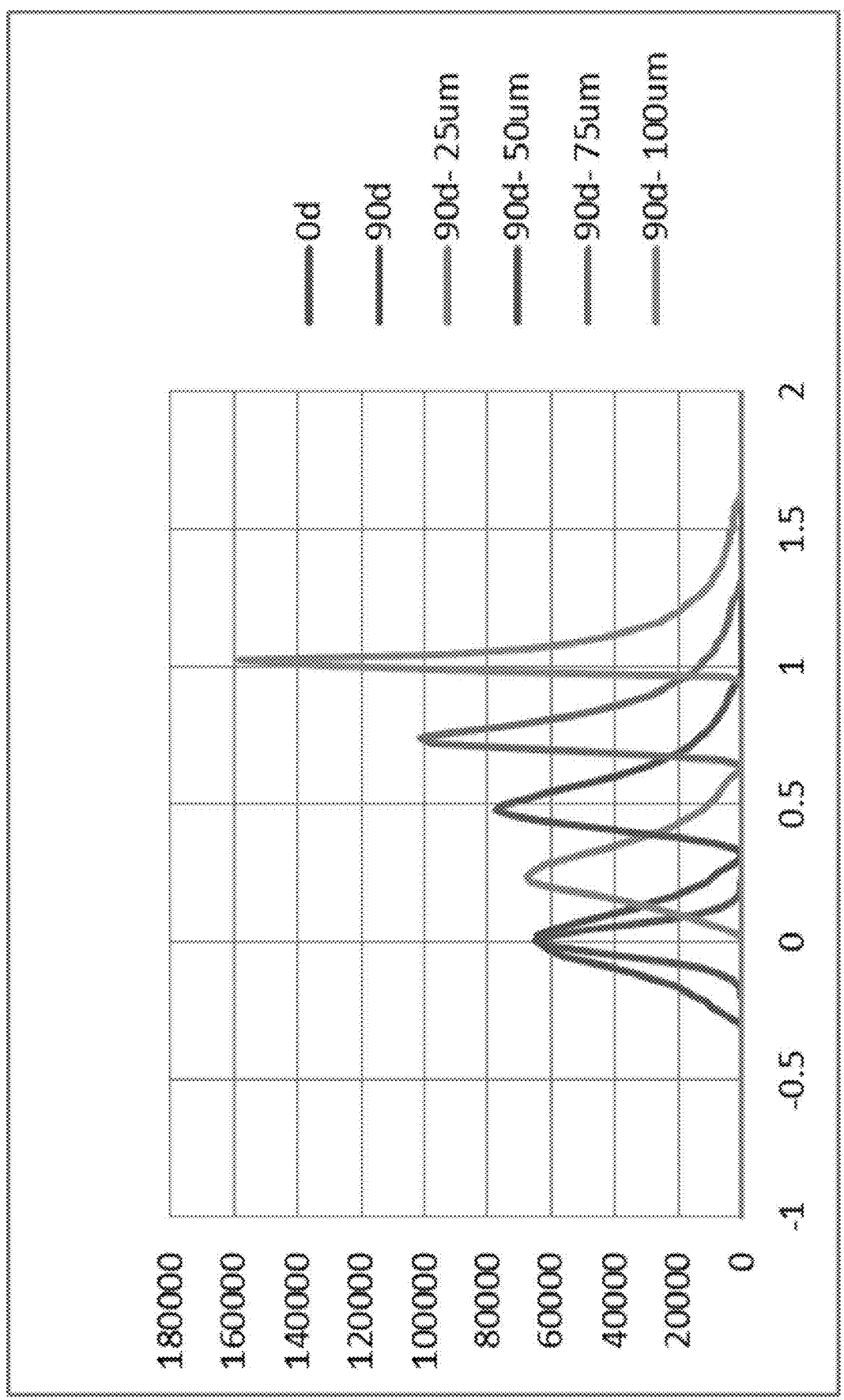
FIG. 10 shows a simulation result of a semiconductor package structure, in accordance with some embodiments of the present disclosure.

FIG. 9A illustrates an experimental or simulation result of the semiconductor device package 2 (air-type package) in accordance with some embodiments of the present disclosure. Referring to FIG. 9A, light intensity is measured or simulated on an X-Y plane at a distance of approximately 30 cm from the optical lens 151. The chart below shows intensity distribution along the X-axis. The chart on the side shows intensity distribution along the Y-axis FIG. 9B illustrates an experimental or simulation result of the semiconductor device package 2 (air-type package) in accordance with some embodiments of the present disclosure. Referring to FIG. 9B, light intensity is measured or simulated on an X-Y plane at a distance of approximately 60 cm from the optical lens 151. The chart below shows intensity distribution along the X-axis. The chart on the side shows intensity distribution along the Y-axis FIG. 9C illustrates an experimental or simulation result of the semiconductor device package 2 (air-type package) in accordance with some embodiments of the present disclosure. Referring to FIG. 9C, light intensity is measured or simulated on an X-Y plane at a distance of approximately 90 cm from the optical lens 151. The chart below shows intensity distribution along the X-axis. The chart on the side shows intensity distribution along the Y-axis FIG. 10 illustrates a simulation result of the semiconductor device package 2 in accordance with some embodiments of the present disclosure. Referring to FIG. 10, light intensity is simulated on an X-Y plane (with 5×5 mm² area). Optical efficiency is approximately 71.5% or 0.715. The line denoted "0d" shows the intensity simulated along the Y-axis. The line denoted "90d" shows the intensity simulated along the X-axis. The line denoted "90d-25 μm" shows the intensity simulated in a case that a misalignment resulted from the bonding operation of approximately 25 μm in the semiconductor device package 2. The line denoted "90d-50 μm" shows the intensity measured or simulated in a case that a misalignment resulted from the bonding operation of approximately 50 μm in the semiconductor device package 2. The line denoted "90d-75 μm" shows the intensity simulated in a case that a misalignment resulted from the bonding operation of approximately 75 μm in the semiconductor device package 2. The line denoted "90d-100 μm" shows the intensity simulated in a case that a misalignment resulted from the bonding operation of approximately 100 μm in the semiconductor device package 2.

Referring to FIG. 7C and FIG. 9C, the optical efficiency of the semiconductor device package 2 (air type package) is higher than that of the semiconductor device package 2a (molding type package). It can also be observed that the scattering light in the semiconductor device package 2a (molding type package) is greater than that in the semiconductor device package 2 (air type package).

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, no greater than 0.5 μm, or no greater than 0.1 μm. A surface can be deemed to be planar or substantially planar if a difference between a highest point and a lowest point of the surface is no greater than 5 μm, no greater than 2 μm, no greater than 1 μm, no greater than 0.5 μm, or no greater than 0.1 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a first substrate having a first surface;
   a second substrate on the first surface of the first substrate, the second substrate having a first surface and a second surface connected to the first surface of the second substrate, a surface area of the first surface of the second substrate being less than a surface area of the second surface, and the first surface of the second substrate being disposed on the first surface of the first substrate; and
   a light source on the second surface of the second substrate.

2. The semiconductor package of claim 1, further comprising a support structure between the first surface of the first substrate and the first surface of the second substrate.

3. The semiconductor package of claim 1, further comprising a protection element covering the light source and the second substrate.

4. The semiconductor package of claim 3, further comprising an optical element over the protection element.

5. The semiconductor package of claim 3, wherein the protection element comprises a molding material, silicone, or glass.

6. The semiconductor package of claim 3, wherein the protection element is separated from the light source by a space.

7. The semiconductor package of claim 1, wherein the light source comprises a light-emitting surface opposite to the first surface of the second substrate.

8. The semiconductor package of claim 1, further comprising a housing, the housing being disposed on the first surface of the first substrate to surround the second substrate and the light source.

9. The semiconductor package of claim 1, wherein the second substrate comprises a conductive via electrically coupled to the first substrate through a conductive material.

10. The semiconductor package of claim 1, further comprising an interposer between the second surface of the second substrate and the light source.

11. The optical package structure of claim 1, wherein the light source comprises a first projection area on the first surface of the first substrate and a second projection area on the second substrate, wherein the first projection area is smaller than the second projection area.

12. An optical package structure, comprising:
    a substrate having a first surface;
    a light source on the first surface of the substrate, the light source having a light-emitting surface, a first surface opposite to the light-emitting surface, and a second surface between the light-emitting surface and the first surface, the first surface of the light source facing the first surface of the substrate, and
    a carrier between the light source and the substrate,
    wherein the light source comprises a first projection area on the first surface of the substrate and a second projection area on the carrier, wherein the first projection area is smaller than the second projection area.

13. The optical package structure of claim 12, further comprising a protection element covering the light source.

14. The optical package structure of claim 13, wherein the protection element comprises a third surface adjacent to the light-emitting surface of the light source and a fourth surface protruded from the third surface of the protection element.

15. The optical package structure of claim 13, wherein the protection element comprises a protrusion structure in proximity to the light-emitting surface.

16. A method of manufacturing an optical package structure, comprising:
   providing a substrate;
   providing an optical module, the optical module comprising:
      a carrier having a first surface and a second surface connected to the first surface, a surface area of the second surface being less than a surface area of the first surface;
      an edge emitting device on the first surface and electrically coupled to the carrier, the edge emitting device comprising a light emitting surface; and
      a protection element covering the edge emitting device and the carrier;
   forming a support structure over the substrate; and
   integrating the optical module with the substrate via the support structure, the light emitting surface being distal to the substrate.

17. The method of claim 16, wherein forming the support structure comprises forming a non-conductive layer over the substrate.

18. The method of claim 16, further comprising:
   disposing a conductive bump over the substrate; and
   connecting a conductive terminal of the carrier to the conductive bump.

19. The method of claim 16, wherein forming the protection element comprises forming a molding material surrounding the carrier and the edge-emitting device or disposing a lid to cover the carrier and the edge-emitting device.

20. The optical package structure of claim 16, wherein the edge emitting device comprises a first projection area on a first surface of the substrate and a second projection area on the carrier, wherein the first projection area is smaller than the second projection area.

* * * * *